United States Patent [19]

Fujii et al.

[11] Patent Number: 5,708,399

[45] Date of Patent: Jan. 13, 1998

[54] MODULATOR AND FREQUENCY MULTIPLIER FOR USE THEREIN

[75] Inventors: Ryota Fujii; Masahiro Tsukahara; Moriaki Mizuno; Minoru Takagi, all of Kasugai, Japan

[73] Assignee: Fujitsu Limited, Kawasaki, Japan

[21] Appl. No.: 674,506

[22] Filed: Jul. 2, 1996

[30] Foreign Application Priority Data

| Sep. 13, 1995 | [JP] | Japan | 7-235829 |
| Sep. 29, 1995 | [JP] | Japan | 7-254165 |
| Feb. 16, 1996 | [JP] | Japan | 8-029516 |

[51] Int. Cl.$^6$ .............................. H03B 19/10; H03C 3/00
[52] U.S. Cl. ........................... 332/103; 332/105; 455/333
[58] Field of Search ..................... 332/103, 104, 332/105, 123, 135, 146, 159, 164, 170; 327/113, 119, 120, 121, 122; 455/47, 109, 118, 302, 333

[56] References Cited

U.S. PATENT DOCUMENTS

| 3,569,732 | 3/1971 | Christensen | 327/122 |
| 4,558,283 | 12/1985 | Yamagiwa | 332/170 X |
| 5,267,023 | 11/1993 | Kawasaki | 332/123 X |
| 5,355,101 | 10/1994 | Ichihara et al. | 332/123 X |
| 5,373,265 | 12/1994 | Davis et al. | 332/170 X |

FOREIGN PATENT DOCUMENTS

| 0498221 | 8/1992 | European Pat. Off. | 327/122 |

*Primary Examiner*—David Mis
*Attorney, Agent, or Firm*—Staas & Halsey

[57] ABSTRACT

A modulator that effectively suppresses carrier leakage is disclosed. The modulator includes a frequency multiplier, a phase shifter and an orthogonal modulator. The frequency multiplier outputs complementary signals whose frequencies are twice the frequency of a first carrier signal. The phase shifter divides the frequencies of the output signals of the frequency multiplier to produce a plurality of second carrier signals whose phases are shifted by 90 degrees from one another. The orthogonal modulator receives an input signal and the second carrier signals from the phase shifter and outputs signals obtained by combining the input signal with the second carrier signals. The frequency multiplier has an input circuit section including a differential circuit. The differential input section receives complementary signals as the first carrier signal. The orthogonal modulator has an output circuit section including a differential circuit.

16 Claims, 21 Drawing Sheets

5,708,399

MODULATOR AND FREQUENCY MULTIPLIER FOR USE THEREIN

BACKGROUND OF THE INVENTION

1. Field of the Invention

The present invention relates to a modulator which is used in a digital mobile communication device and, more particularly, to a frequency multiplier incorporated in the modulator.

1. Description of the Related Art

Multifarious applications are prepared for digital mobile communication devices. A modulator is one of the essential components of such a digital mobile communication device. For accurate modulation, there is a need to suppress carrier leakage in the modulator.

FIG. 1 shows a conventional modulator 11 for use in a digital mobile communication device. The modulator 11 is of an orthogonal modulation type and includes a frequency multiplier 12, a phase shifter 13 comprised of flip-flops, and an orthogonal modulator 14.

The frequency multiplier 12 receives a carrier signal LO as shown in FIG. 3 and outputs a signal 2LO to the phase shifter 13. The signal 2LO has a frequency that is twice the frequency of that carrier signal LO. The phase shifter 13 divides the frequency of the signal 2LO to a half to yield carrier signals $LO_0$, $LO_{90}$, $LO_{180}$ and $LO_{270}$ whose phases are shifted by 90 degrees from one another, and sends those carrier signals to the orthogonal modulator 14. The carrier signals $LO_0$ and $LO_{180}$ are complementary to each other, while the carrier signals $LO_{90}$ and $LO_{270}$ are complementary to each other. The numerals after "LO" represent the relative angles.

The orthogonal modulator 14 includes a pair of modulation mixers 15 and 16 and an adder 17. The first mixer 15 multiplies a baseband signal I by the carrier signals $LO_0$ and $LO_{180}$ to produce their combined modulation signal. The second mixer 16 multiplies a baseband signal Q by the carrier signals $LO_{90}$ and $LO_{270}$ to produce their combined modulation signal. The adder 17 adds the output signals of the mixers 15 and 16 together to produce an output signal MF.

FIG. 2 illustrates the SSB (Single SideBand) spectrum waveform of the output signal MF of an ordinary modulator. This SSB spectrum shows that a carrier leak CL appears on the frequency of the carrier signal LO. A modulation signal Pout appears on the frequency which is higher than the frequency of the carrier signals LO by the amount of the frequency fa of the baseband signals I and Q, and an image rejection IR appears on the frequency which is lower than the frequency of the carrier signals LO by the amount of the frequency fa of the baseband signals I and Q. The image rejection IR suggests the symmetry of the internal circuits (I side and Q side) of the orthogonal modulator and the performance of the phase shifter.

The phase shifter 13 in the modulator 11 shown in FIG. 1 produces the phase differences among the four carrier signals $LO_0$, $LO_{90}$, $LO_{270}$ and $LO_{270}$ based on the output signal 2LO of the frequency multiplier 12. There are two cases with respect to the relationship between the phase of the carrier signal LO and the phase of the carrier signal $LO_0$. In the first case, as the carrier signal LO rises, the carrier signal $LO_0$ also rises as shown in FIG. 3. In the second case, as the carrier signal LO falls, the carrier signal $LO_0$ rises as shown in FIG. 5. That is, there is the case where the carrier signal LO and the carrier signal $LO_0$ become in phase and the case where they have the opposite phases to each other.

When the carrier signal LO and the carrier signal $LO_0$ become in phase as shown in FIG. 3, the power level of the carrier leak CL of the output signal MF becomes small as indicated by the SSB spectrum waveform in FIG. 4. The small power level of the carrier leak CL does not interface with proper operation of the modulator 11. When the phase of the carrier signal LO is opposite to that of the carrier signal $LO_0$ as shown in FIG. 5, the power level of the carrier leak CL of the output signal MF becomes large as indicated by the SSB spectrum waveform in FIG. 6. The large power level of the carrier leak CL does result in improper operation of the modulator 11.

FIG. 7 shows another conventional modulator 21, which is of an orthogonal modulation type and has a frequency multiplier 22, a phase shifter 23 comprised of flip-flops, and the same orthogonal modulator 14 as shown in FIG. 1.

The frequency multiplier 22 receives a carrier signal LO as shown in FIG. 3 and outputs complementary signals 2LO and 2LOX to the phase shifter 23. The complementary signal 2LO and 2LOX are obtained by multiplying the frequency of the carrier signal LO by two. The phase shifter 23 divides the frequencies of the signals 2LO and 2LOX by two to yield carrier signals $LO_0$, $LO_{90}$, $LO_{180}$ and $LO_{270}$ whose phases are shifted by 90 degrees from one another, and sends those carrier signals to the orthogonal modulator 14.

The modulator 21 also operates in two cases. In the first case, the carrier signal LO and the carrier signal $LO_0$ become in phase, and in the other case, the phases of these carrier signals are opposite to each other. When the phase of the carrier signal LO becomes opposite to that of the carrier signal $LO_0$, therefore, the power level of the carrier leak CL of the output signal MF becomes large, which results in improper operation of the modulator 21.

SUMMARY OF THE INVENTION

Broadly speaking, the present invention relates to a modulator capable of suppressing the carrier leak regardless of the phase of the carrier signal output from a phase shifter. The present invention also relates to a frequency multiplier for use in the modulator.

A modulator according to the present invention includes a frequency multiplier, a phase shifter and an orthogonal modulator. The frequency multiplier outputs complementary signals whose frequencies are twice the frequency of a first carrier signal. The phase shifter divides the frequencies of output signals of the frequency multiplier to produce a plurality of second carrier signals whose phases are shifted by 90 degrees from one another. The orthogonal modulator receives an input signal and the second carrier signals from the phase shifter and outputs signals obtained by combining the input signal with the second carrier signals. The frequency multiplier has a differential input section including a differential circuit. The differential input section receives complementary signals as the first carrier signal. It is preferable that the orthogonal modulator have an output section including a differential circuit. According to the modulator of the present invention, the leakage of complementary carriers, which are latent to the whole modulator, tend to cancel out each other, thereby suppressing or reducing the occurrence of carrier-leak originated noise.

A frequency multiplier according to the present invention has a signal converter and an analog multiplier, and produces a signal whose frequency is twice the frequency of an input voltage signal. The signal converter produces first and second signals which have a phase difference of 90 degrees, based on the input voltage signal. The analog multiplier includes first and second differential circuits operable based on the first signal, and a second differential circuit for alternately enabling the first and second differential circuits based on the second signal. The analog multiplier combines the first and second signals to produce a signal whose frequency is twice the frequency of the input voltage signal. The frequency multiplier embodying the present invention performs a low spurious frequency multiplying operation.

Other aspects and advantages of the invention will become apparent from the following detailed description, taken in conjunction with the accompanying drawings, illustrating by way of example the principals of the invention.

BRIEF DESCRIPTION OF THE DRAWINGS

The invention, together with objects and advantages thereof, may best be understood by reference to the following description of the presently preferred embodiments together with the accompanying drawings, wherein.

DETAILED DESCRIPTION OF THE PREFERRED EMBODIMENTS

First Embodiment

Figure 1:
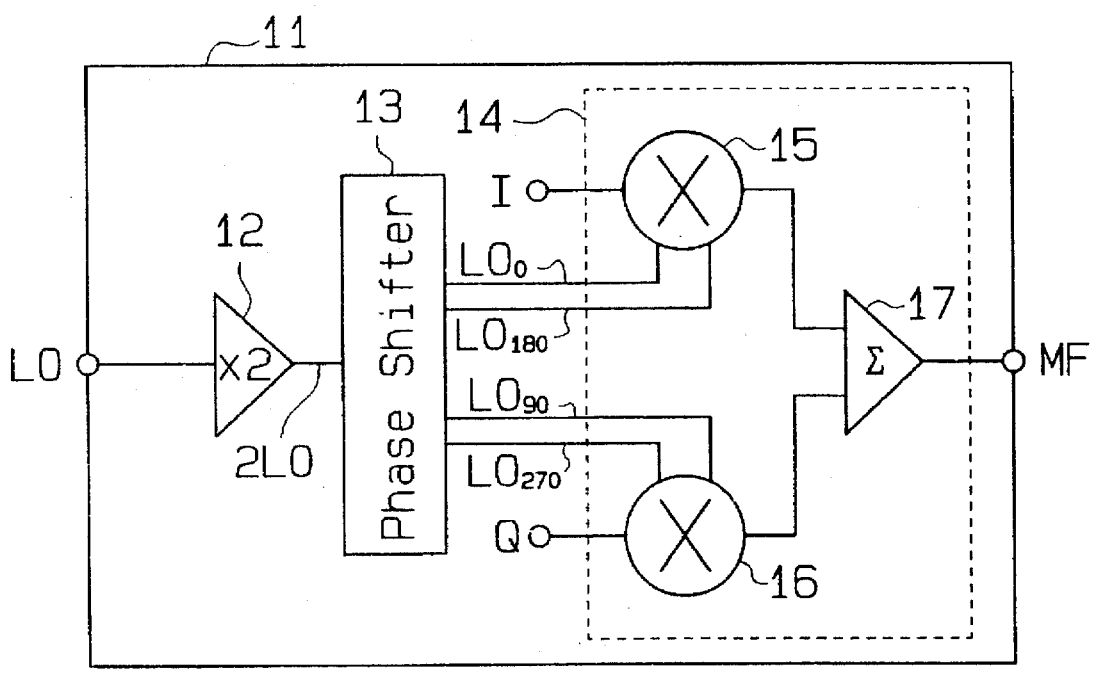
FIG. 1 is a circuit diagram showing a conventional modulator.
Figure 2:
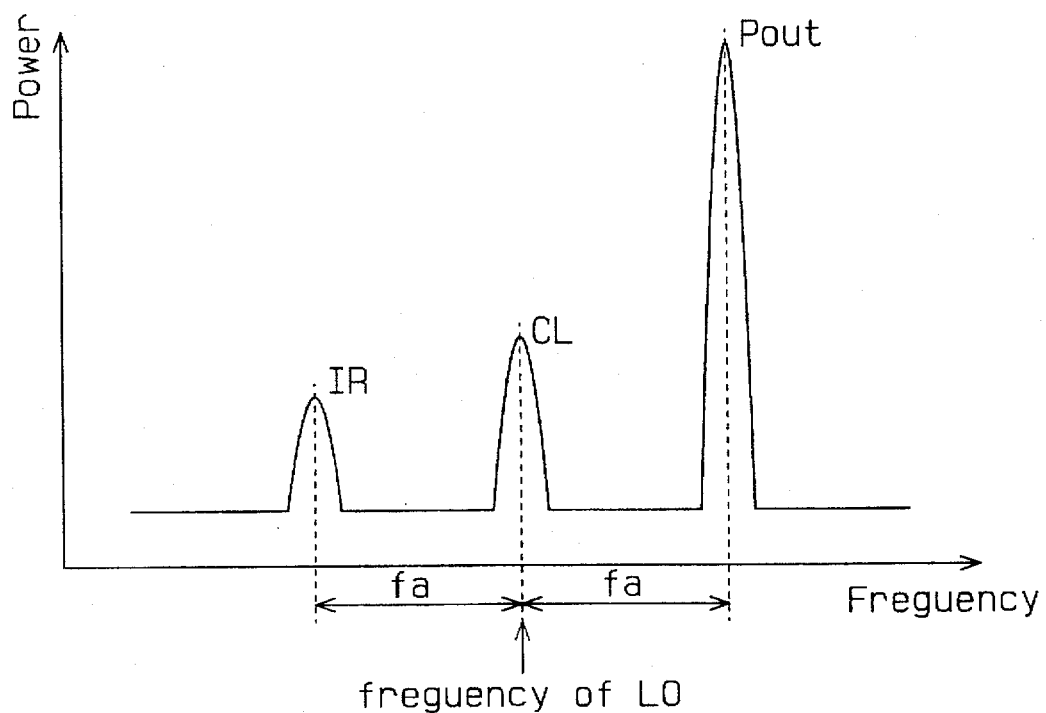
FIG. 2 is a diagram showing the SSB spectrum waveform of the output of an ordinary modulator.
Figure 3:
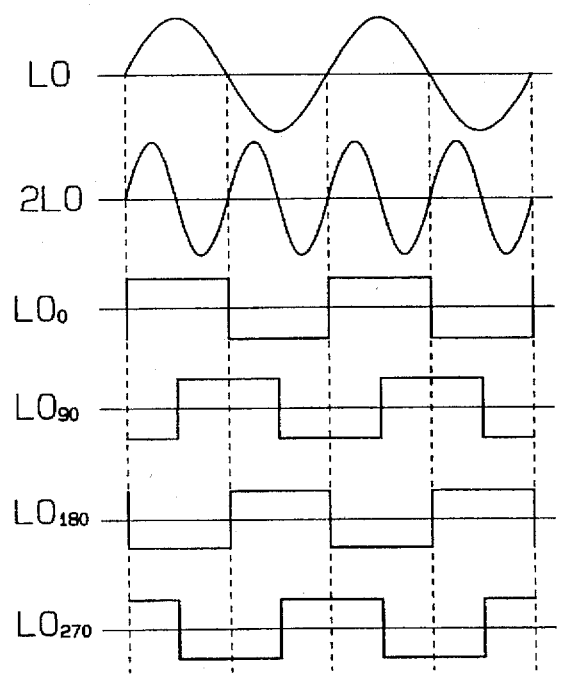
FIG. 3 is a waveform diagram of signals in the modulator shown in FIG. 1.
Figure 4:
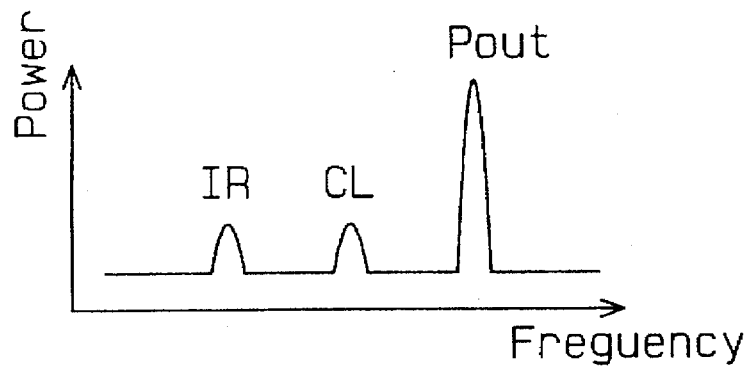
FIG. 4 is a diagram of an SSB spectrum waveform corresponding to the signals shown in FIG. 3.
Figure 5:
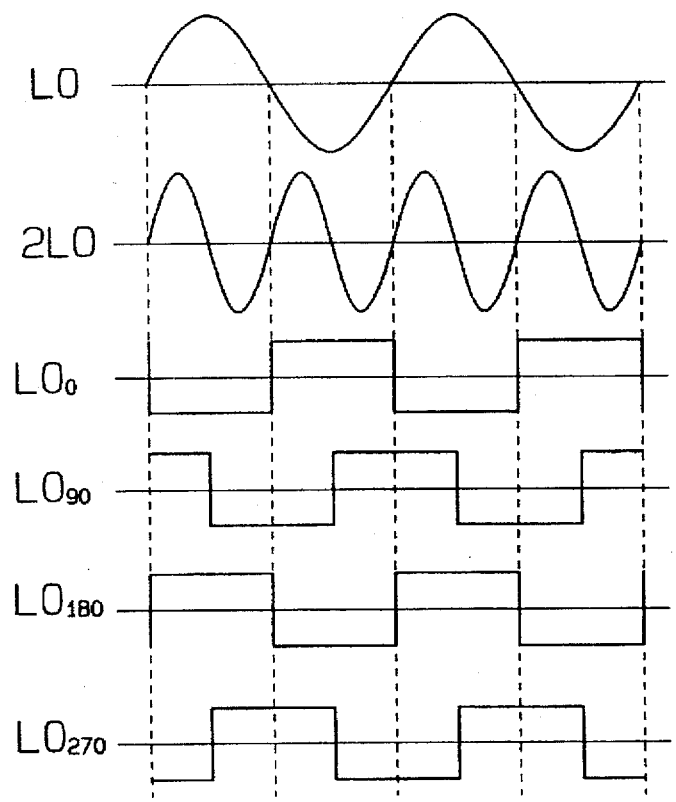
FIG. 5 is a waveform diagram of signals in the modulator shown in FIG. 1.
Figure 6:
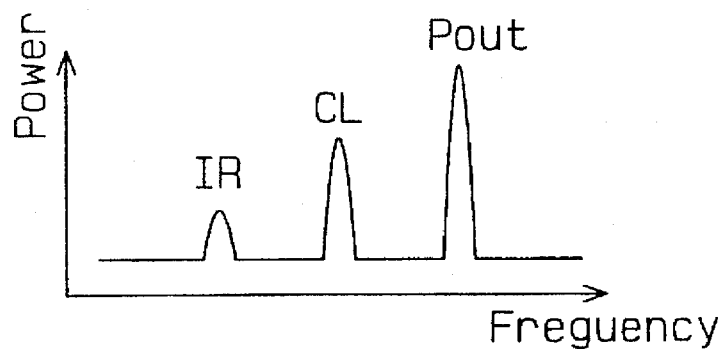
FIG. 6 is a diagram of an SSB spectrum waveform corresponding to the signals shown in FIG. 5.
Figure 7:
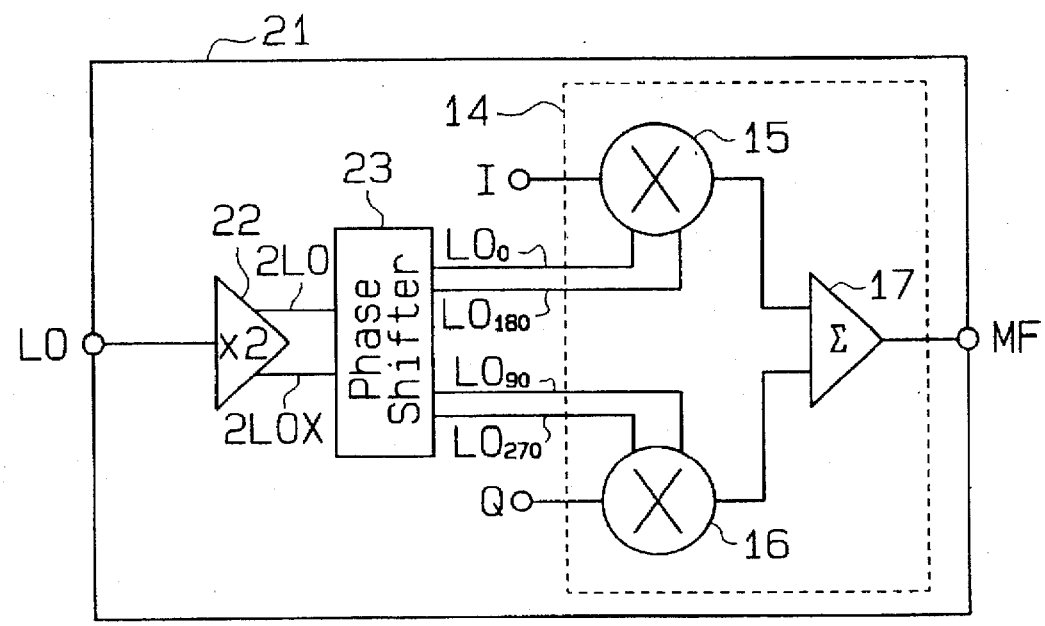
FIG. 7 is a circuit diagram showing another conventional modulator.
Figure 8:
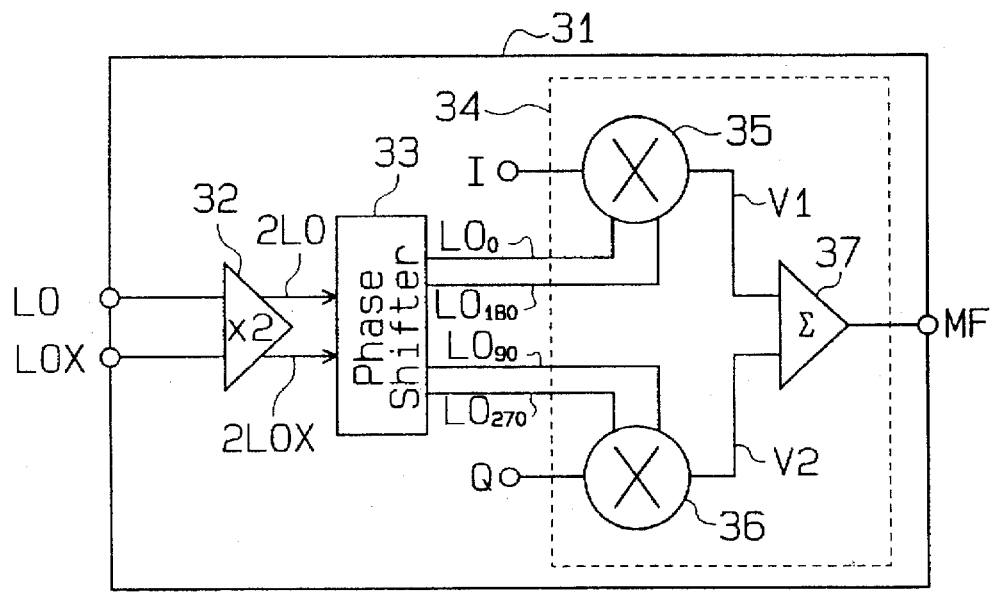
FIG. 8 is a circuit diagram illustrating a modulator according to a first embodiment of the present invention.

A modulator according to a first embodiment of the present invention will now be described with reference to FIGS. 8 through 14. As shown in FIG. 8, a modulator 31 of an orthogonal modulation type which is useful for a digital mobile communication device has a frequency multiplier 32, a phase shifter 33 comprised of flip-flops, and an orthogonal modulator 34.

Figure 9:
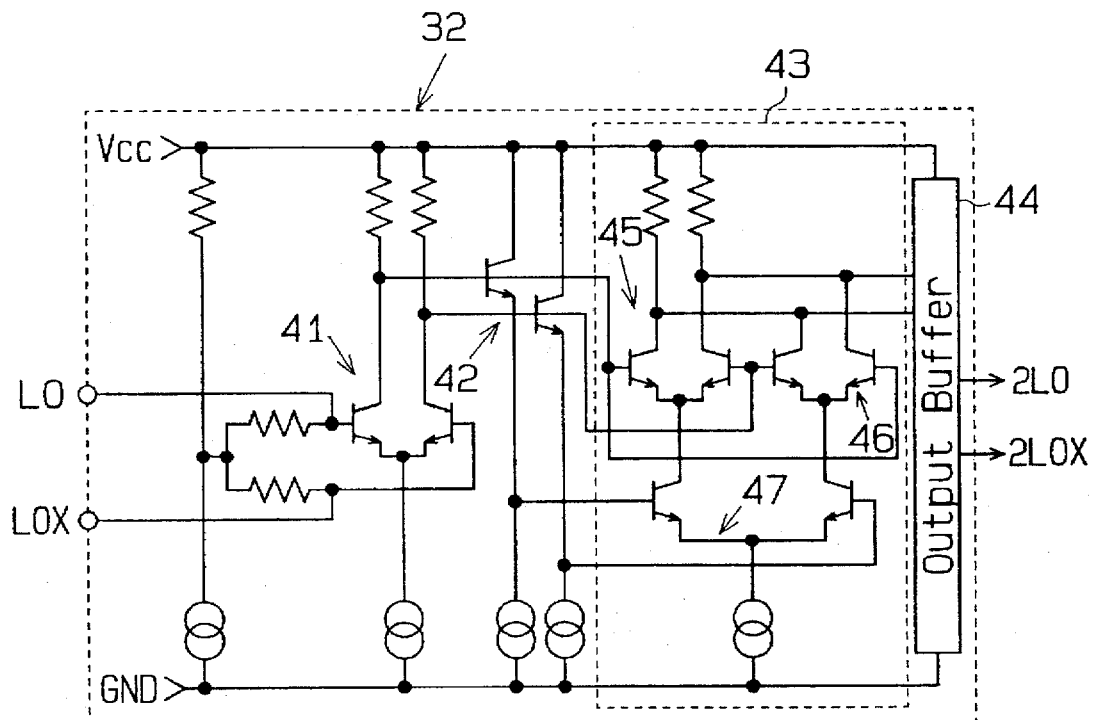
FIG. 9 is a circuit diagram of a frequency multiplier shown in FIG. 8.

The frequency multiplier 32 receives complementary carrier signals LO and LOX (see FIG. 13), and produces complementary signals 2LO and 2LOX whose frequencies are twice the frequencies of the carrier signals LO and LOX. The complementary signals 2LO and 2LOX are then output to the phase shifter 33. As shown in FIG. 9, the frequency multiplier 32 has an input differential circuit 41, an emitter follower circuit 42, an analog multiplier 43 and an output buffer 44.

The differential circuit 41 comprises a pair of emitter-coupled NPN transistors whose bases are respectively supplied with the complementary carrier signals LO and LOX. The differential circuit 41 amplifies the carrier signals LO and LOX, and then sends out complementary amplified signals to the emitter follower circuit 42 and the analog multiplier 43.

The emitter follower circuit 42 comprises a pair of NPN transistors which send complementary signals having the same frequencies as those of the carrier signals LO and LOX to the analog multiplier 43 from their emitters.

The analog multiplier 43 has first, second and third differential circuits 45, 46 and 47. A pair of NPN transistors of the third differential circuit 47 receive the complementary outputs of the emitter follower circuit 42. The third differential circuit 47 alternately enables the first and second differential circuits 45 and 46 based on the complementary outputs of the emitter follower circuit 42. The first and second differential circuits 45 and 46, when enabled by the third differential circuit 47, operate based on the complementary amplified signals from the differential circuit 41 and outputs complementary signals to the output buffer 44. The output buffer 44 outputs complementary signals 2LO and 2LOX based on the output signals of the first and second differential circuits 45 and 46.

The phase shifter 33 shown in FIG. 8 receives the output signals 2LO and 2LOX from the frequency multiplier 32 and divides the frequency of the output signal 2LO by two to produce carrier signals $LO_0$, $LO_{90}$, $LO_{180}$ and $LO_{270}$ whose phases signals are shifted by 90 degrees from one another. Those carrier signals are sent to the orthogonal modulator 34. The frequencies of the carrier signals $LO_0$, $LO_{90}$, $LO_{180}$ and $LO_{270}$ are the same as the frequency of the carrier signal LO. The carrier signals $LO_0$ and $LO_{180}$ are complementary to each other, and the carrier signals $LO_{90}$ and $LO_{270}$ are complementary to each other.

Figure 10:
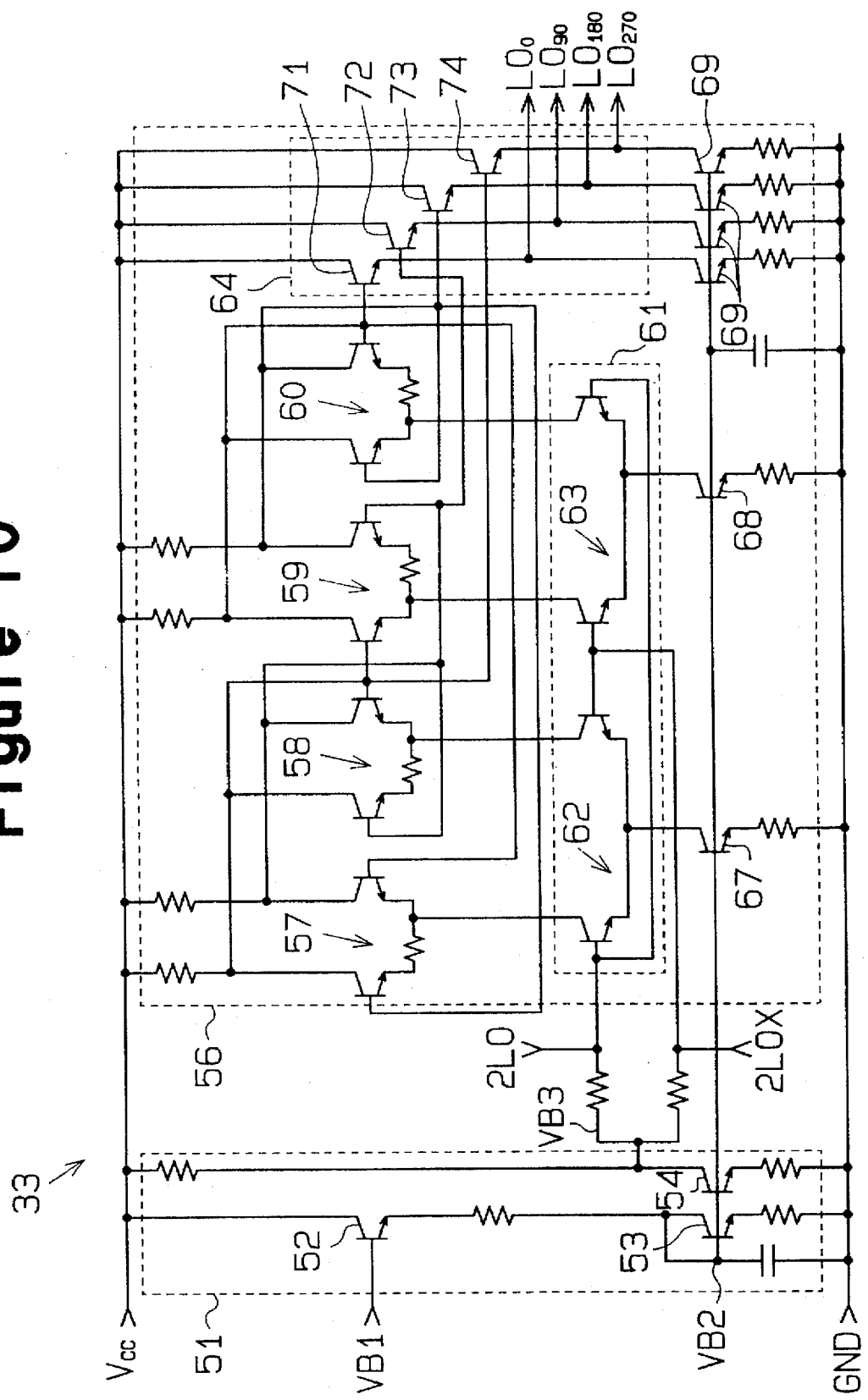
FIG. 10 is a circuit diagram depicting a phase shifter in FIG. 8.

As illustrated in detail in FIG. 10, the phase shifter 33 includes a bias generator 51 and a frequency divider 56. The bias generator 51 has three NPN transistors 52, 53 and 54. The NPN transistors 53 and 54 constitute a current mirror circuit. The NPN transistor 52 has a collector connected to a power supply $V_{CC}$, an emitter connected to the collector of the NPN transistor 53 via a resistor, and a base which is supplied with a reference signal VB1. The NPN transistor 53 has a base connected to its collector and an emitter connected to ground GND via a resistor. The NPN transistor 54 has a collector connected via a resistor to the power supply $V_{CC}$, an emitter connected via a resistor to the ground GND and a base connected to the collector of the NPN transistor 53.

Based on the reference signal VB1, the identical current flows through the NPN transistors 53 and 54. Consequently, the NPN transistor 53 provides the frequency divider 56 with a reference signal VB2 as a bias, while the NPN transistor 54 provides the frequency divider 56 with a reference signal VB3 as a bias.

The frequency divider 56 has four differential circuits 57, 58, 59 and 60, an activation circuit 61, an emitter follower circuit 64, and a plurality of activation transistors 67, 68 and 69 each comprised of an NPN transistor.

The activation circuit 61 has two differential circuits 62 and 63. The base of one of a pair of NPN transistors in each of the differential circuits 62 and 63 is supplied with the reference signal VB3 and the output signal 2LO, and the base of the other NPN transistor in each differential circuit 62 or 63 is supplied with the reference signal VB3 and the output signal 2LOX.

When the activation transistors 67, 68 and 69 are turned on based on the reference signal VB2, the frequency divider 56 is enabled. Then, the activation circuit 61 alternately enables a pair of the differential circuits 57 and 60 and a pair of the differential circuits 58 and 59 in response to the output signals 2LO and 2LOX.

The emitter follower circuit 64 has four NPN transistors 71, 72, 73 and 74. Based on the operations of the four differential circuits 57–60, the switching actions of the NPN transistors 71–74 are controlled to produce the carrier signals $LO_0$, $LO_{90}$, $LO_{180}$ and $LO_{270}$ whose frequencies are half that of those of the output signals 2LO and 2LOX.

The orthogonal modulator 34 shown in FIG. 8 has a pair of modulation mixers 35 and 36 and an adder 37. The first modulation mixer 35 multiplies a baseband signal I as a digital input signal by the carrier signals $LO_0$ and $LO_{180}$ to produce a modulation signal V1. The second modulation mixer 36 multiplies a baseband signal Q as a digital input signal by the carrier signals $LO_{90}$ and $LO_{270}$ to produce a modulation signal V2.

Figure 11:
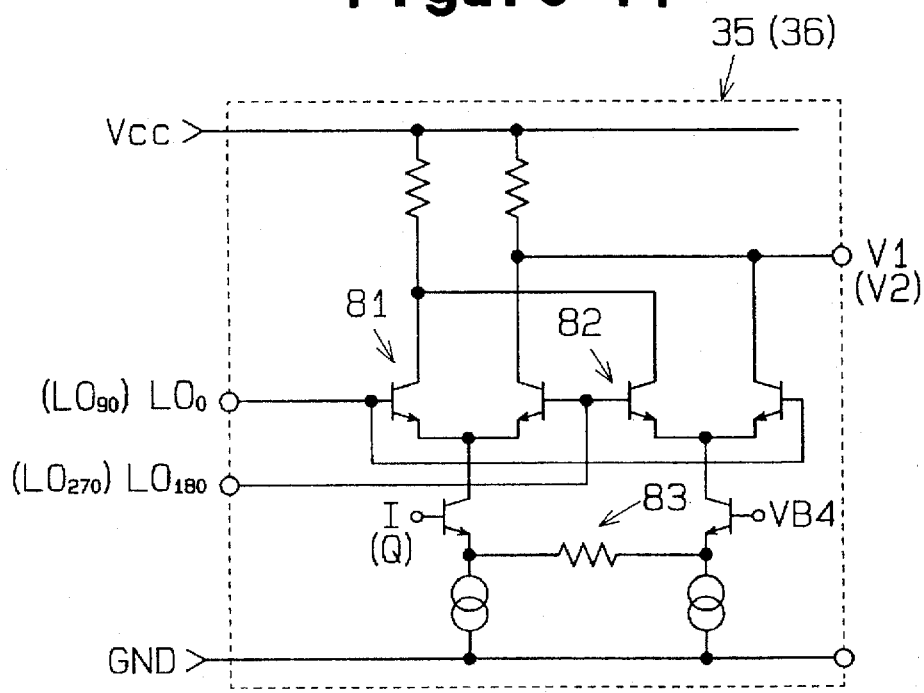
FIG. 11 is a circuit diagram of a modulation mixer shown in FIG. 8.

As shown in FIG. 11, the first modulation mixer 35 has differential circuits 81 and 82 and an activation circuit 83. The activation circuit 83 has a pair of NPN transistors whose emitters are connected together via a resistor. The base of one of the NPN transistors is supplied with the baseband signal I, and the base of the other NPN transistor is supplied with a reference signal VB4. Based on the baseband signal I and reference signal VB4, the activation circuit 83 alternately enables the differential circuits 81 and 82. The base of one of a pair of NPN transistors in each of the differential circuits 81 and 82 is supplied with the carrier signal $LO_0$ and the base of the other NPN transistor in the differential circuit 81 or 82 is supplied with the carrier signal $LO_{180}$. While being enabled by the activation circuit 83, the differential circuits 81 and 82 operate based on the complementary carrier signals $LO_0$ and $LO_{180}$ to produce the modulation signal V1.

The second modulation mixer 36 has the same structure as the first modulation mixer 35. The base of one of a pair of NPN transistors in the activation circuit 83 is supplied with the baseband signal Q, and the base of the other NPN transistor is supplied with the reference signal VB4. The base of one of a pair of NPN transistors in each of the differential circuits 81 and 82 is supplied with the carrier signal $LO_{90}$ and the base of the other NPN transistor in the differential circuit 81 or 82 is supplied with the carrier signal $LO_{270}$.

While being enabled by the activation circuit 83, the differential circuits 81 and 82 in the second modulation mixer 36 operate based on the complementary carrier signals $LO_{90}$ and $LO_{270}$ to produce the modulation signal V2.

Figure 12:
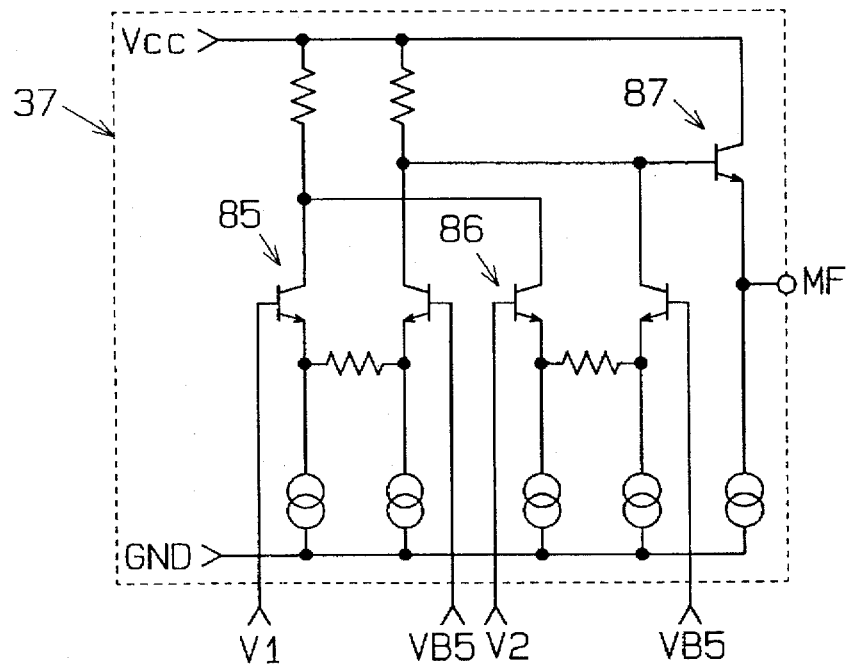
FIG. 12 is a circuit diagram showing an adder in FIG. 8.

The adder 37 adds the modulation signals V1 and V2 from the two mixers 35 and 36 to produce an output signal MF. As shown in FIG. 12, the adder 37 has first and second differential circuits 85 and 86, and an emitter follower circuit 87 as an output section.

The first differential circuit 85 has a pair of NPN transistors whose emitters are connected together via a resistor. The base of one of the NPN transistors is supplied with the modulation signal V1, and the base of the other NPN transistor is supplied with a reference signal VB5. The first differential circuit 85 supplies an amplified signal, obtained by amplifying the modulation signal V1 based on the reference signal VB5, to the emitter follower circuit 87.

The second differential circuit 86 likewise has a pair of NPN transistors whose emitters are connected together via a resistor. The base of one of the NPN transistors is supplied with the modulation signal V2, and the base of the other NPN transistor is supplied with the reference signal VB5. The second differential circuit 86 supplies an amplified signal, obtained by amplifying the modulation signal V2 based on the reference signal VB5, to the emitter follower circuit 87. The emitter follower circuit 87 has a single NPN transistor that outputs from its emitter the output signal MF based on the output signals of the differential circuits 85 and 86.

Figure 13:
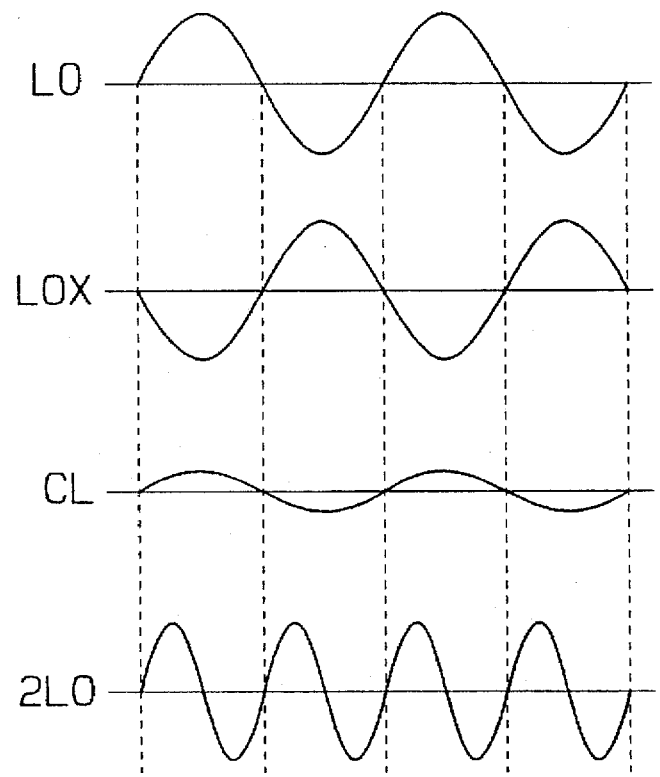
FIG. 13 is a waveform diagram of signals in the modulator shown in FIG. 8.
Figure 14:
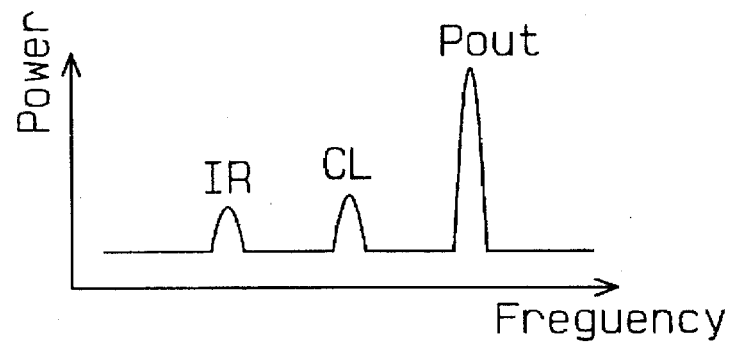
FIG. 14 is a diagram of the SSB spectrum waveform of the output of the modulator in FIG. 8.

According to the modulator 31 of the first embodiment, the frequency multiplier 32 receives the complementary carrier signals LO and LOX and sends out the complementary output signals 2LO and 2LOX based on the carrier signals LO and LOX. The phase shifter 33 produces the phase differences among the carrier signals $LO_0$, $LO_{90}$, $LO_{180}$ and $LO_{270}$ based on the complementary output signals 2LO and 2LOX from the frequency multiplier 32. Therefore, a part of the leak of the carrier signal LO and a part of the leak of the carrier signal LOX, both leaks being latent to the modulator 31, cancel out each other, thus reducing the amplitude level of the carrier leak CL as shown in FIG. 13. Irrespective of the phase of the carrier signal LO, therefore, the power level of the carrier leak CL from the output signal MF is suppressed as indicated by the SSB spectrum in FIG. 14. Consequently, the modulator 31 operates properly.

Second Embodiment

A second embodiment of the present invention will be now described with reference to FIGS. 15 through 17. To avoid the redundant description, like or same reference numerals are given to those components of the second embodiment, which are the same as the corresponding components of the first embodiment.

Figure 15:
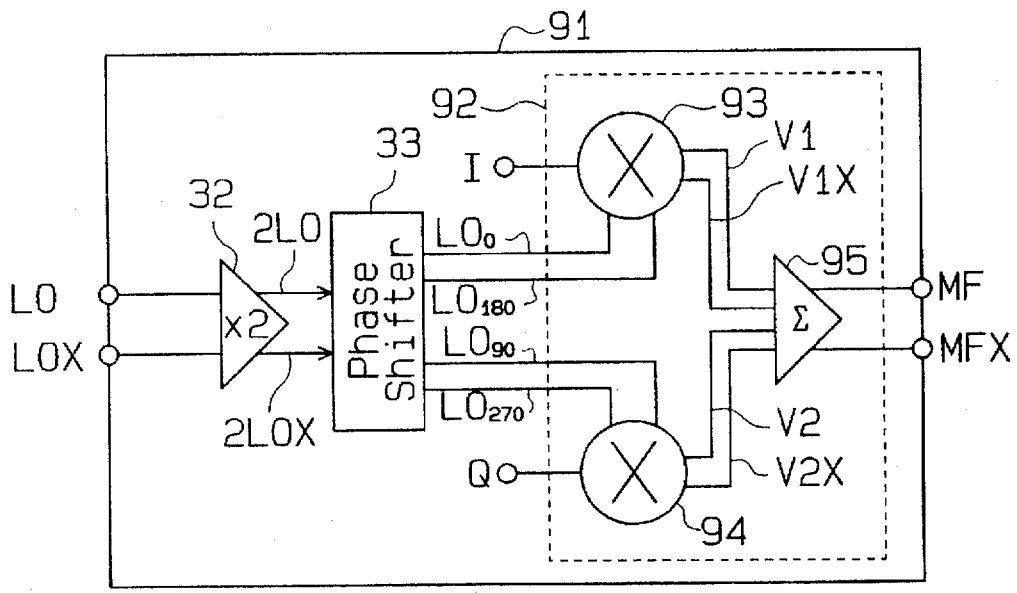
FIG. 15 is a circuit diagram illustrating a modulator according to a second embodiment of the present invention.

As shown in FIG. 15, a modulator 91 according to the second embodiment is of an orthogonal modulation type and has a frequency multiplier 32, a phase shifter 33, and an orthogonal modulator 92. The orthogonal modulator 92 includes first and second modulation mixers 93 and 94 and an adder 95.

Figure 16:
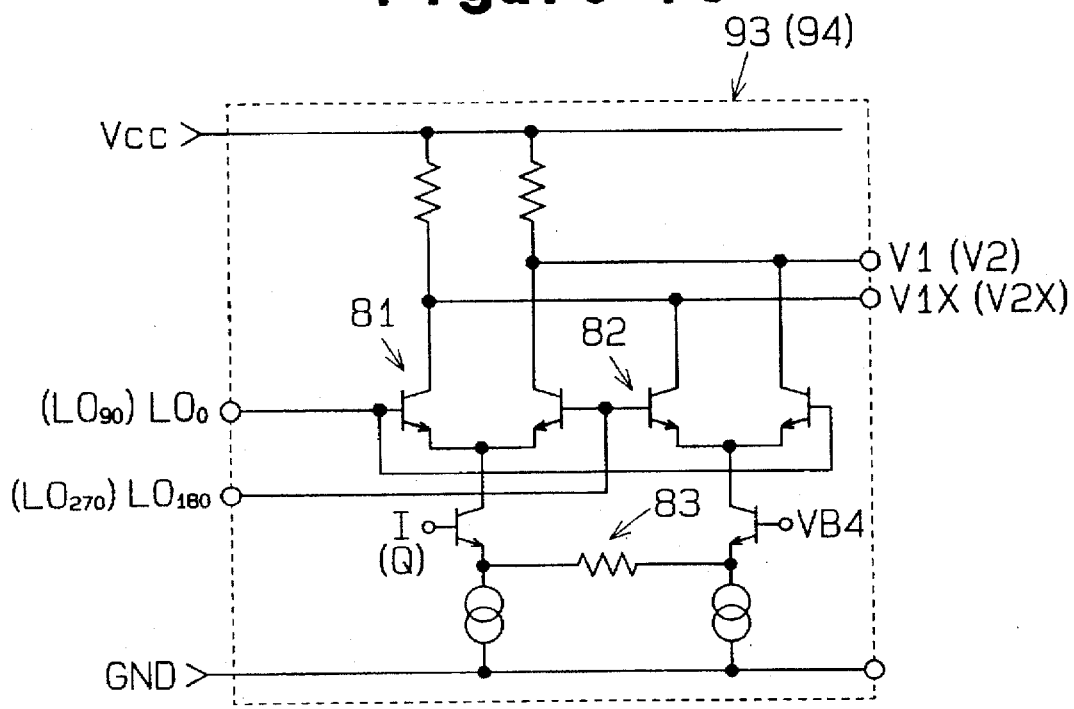
FIG. 16 is a circuit diagram of a modulation mixer in FIG. 15.

As shown in FIG. 16, the first modulation mixer 93 differs from the mixer 35 shown in FIG. 11 in that complementary modulation signals V1 and V1X are output from the collectors of a pair of NPN transistors in each of the differential circuits 81 and 82. The second modulation mixer 94 likewise has the same structure as the first modulation mixer 93, and outputs the complementary modulation signals V2 and V2X from the collectors of the pair of NPN transistors in the differential circuit 81 or 82.

Figure 17:
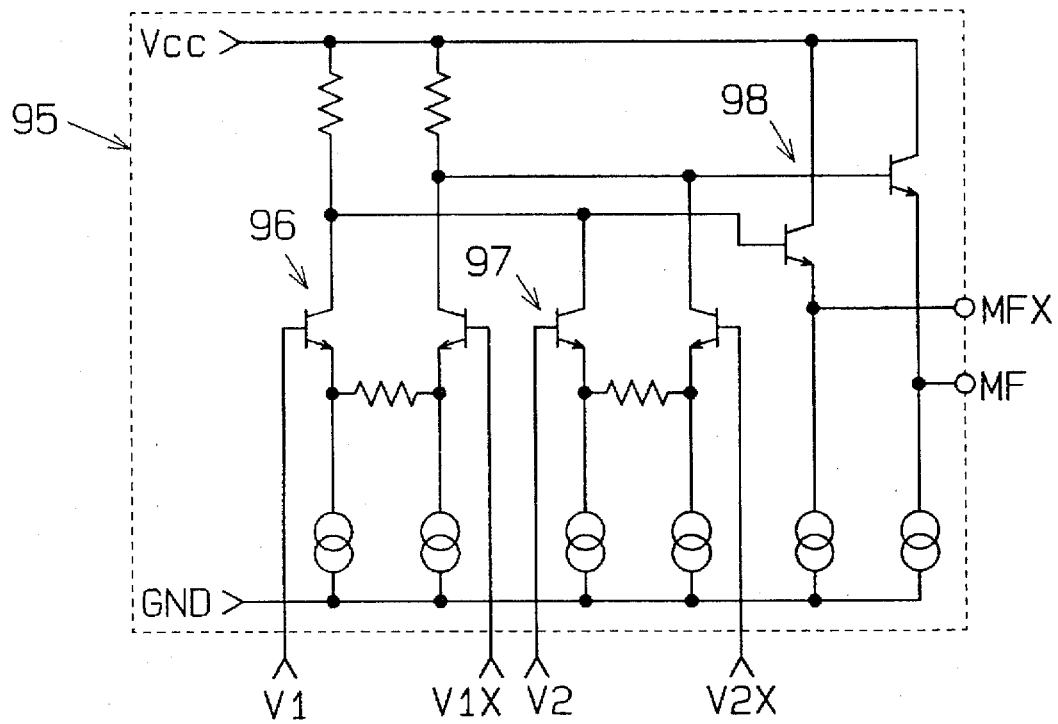
FIG. 17 is a circuit diagram showing an adder in FIG. 15.

As shown in FIG. 17, the adder 95 has first and second differential circuits 96 and 97 and an emitter follower circuit 98 as an output section. The first differential circuit 96 differs from the differential circuit 85 shown in FIG. 12 in that the complementary modulation signals V1 and V1X are input to the bases of its pair of NPN transistors. The second differential circuit 97 differs from the differential circuit 86 shown in FIG. 12 in that the complementary modulation signals V2 and V2X are input to the bases of its pair of NPN transistors. The emitter follower circuit 98 has the differential output structure having a pair of NPN transistors from the emitters of which complementary output signals MF and MFX based on the output signals of the differential circuits 96 and 97 are output.

According to the modulator 91 of the second embodiment, the frequency multiplier 32 receives the complementary carrier signals LO and LOX, and the adder 95 of the orthogonal modulator 92 outputs the modulator 92 outputs the complementary output signals MF and MFX. Therefore, a part of the leak of the carrier signal LO and a part of the leak of the carrier signal LOX, both leaks being latent to the modulator 91, cancel out each other, thus further suppressing the carrier leaks from the output signals MF and MFX. Consequently, the modulator 91 operates more properly.

Third Embodiment

Figure 19:
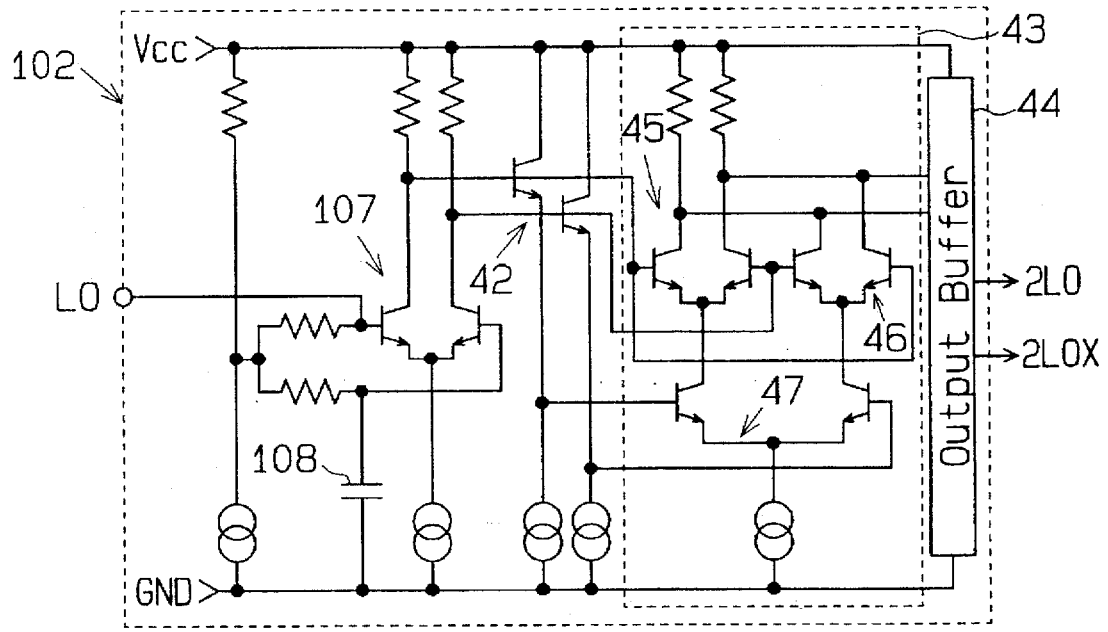
FIG. 19 is a circuit diagram of a frequency multiplier in FIG. 18.
Figure 20:
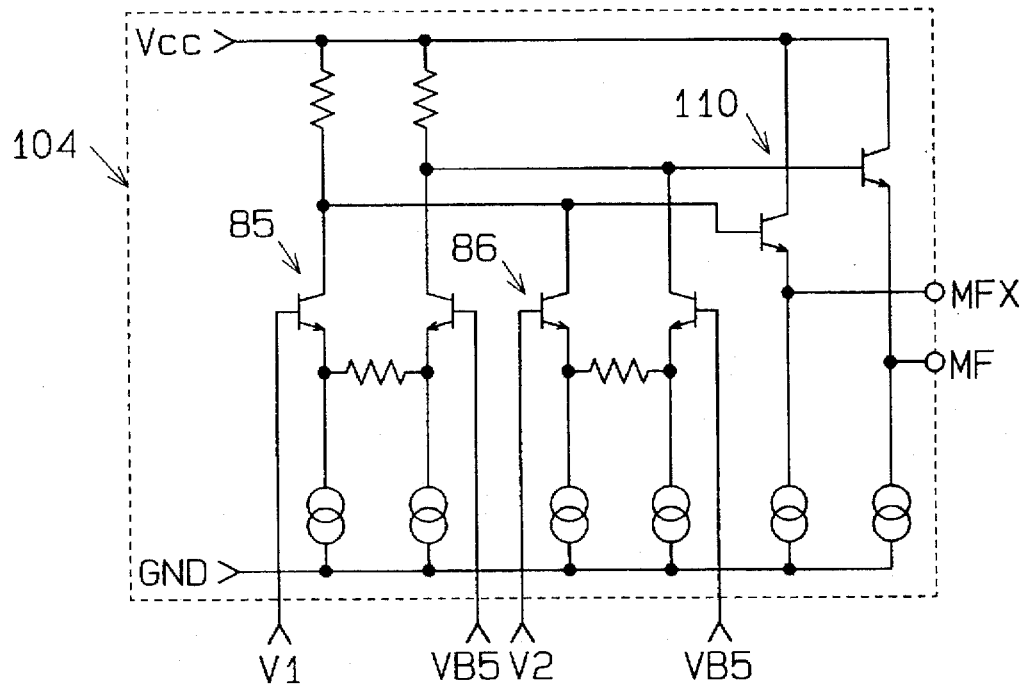
FIG. 20 is a circuit diagram showing an adder in FIG. 18.

A third embodiment of the present invention will be now described with reference to FIGS. 18 through 20. To avoid the redundant description, like or same reference numerals are given to those components of the third embodiment, which are the same as the corresponding components of the first and second embodiments.

Figure 18:
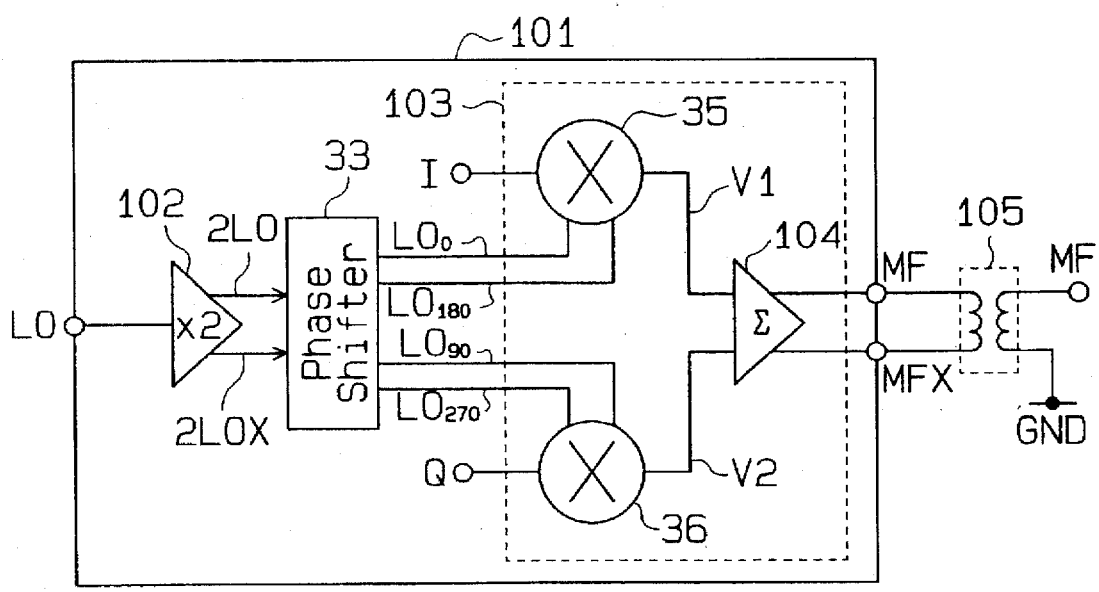
FIG. 18 is a circuit diagram illustrating a modulator according to a third embodiment of the present invention.

As shown in FIG. 18, a modulator 101 according to the third embodiment is of an orthogonal modulation type and has a frequency multiplier 102, a phase shifter 33 of the same type as the aforementioned one, an orthogonal modulator 103 and a balloon coil 105. As illustrated in detail in FIG. 19, the frequency multiplier 102 includes an input differential circuit 107, an emitter follower circuit 42, an analog multiplier 43 and an output buffer 44.

The differential circuit 107 has a pair of emitter-coupled NPN transistors. The base of one of the NPN transistors is supplied with the carrier signal LO and the base of the other NPN transistor is connected to the ground GND via a capacitor 108. The differential circuit 107 provides the emitter follower circuit 42 and analog multiplier 43 with complementary amplified signals obtained by amplifying the carrier signal LO.

The operations of the emitter follower circuit 42, analog multiplier 43 and output buffer 44 have been already described in the foregoing description of the first embodiment. The output buffer 44 outputs two complementary signals 2LO and 2LOX obtained by multiplying the frequency of the carrier signal LO by two.

The orthogonal modulator 103 shown in FIG. 18 has the aforementioned pair of modulation mixers 35 and 36 and an adder 104. As illustrated in detail in FIG. 20, the adder 104 has the aforementioned differential circuits 85 and 86 and an emitter follower circuit 110 as an output section.

The emitter follower circuit 110 employs a differential output structure having a pair of NPN transistors from whose emitters complementary output signals MF and MFX are output based on the output signals of the differential circuits 85 and 86.

The balloon coil 105 shown in FIG. 18 comprises primary and secondary coils. The complementary output signals MF and MFX are supplied to both ends of the primary coil, while the secondary coil has one end connected to the ground GND and the other end serving as the output terminal. The balloon coil 105 combines the complementary output signals MF and MFX to output the output signal MF from the secondary coil.

According to the modulator 101 of the third embodiment, the frequency multiplier 102 receives the carrier signal LO, and outputs the complementary output signals 2LO and 2LOX, and the adder 104 of the orthogonal modulator 103 outputs the complementary output signals MF and MFX. Therefore, the canceling of a part of the leak of the carrier signal LO with a part of the leak of the carrier signal LOX, both leaks being latent to the modulator 91, can suppress the carrier leaks from the output signals MF and MFX. Accordingly, the modulator 101 operates more properly.

Fourth Embodiment

A fourth embodiment of the present invention will now be described with reference to FIG. 21. To avoid the redundant description, like or same reference numerals are given to those components of the fourth embodiment, which are the same as the corresponding components of the first to third embodiments.

Figure 21:
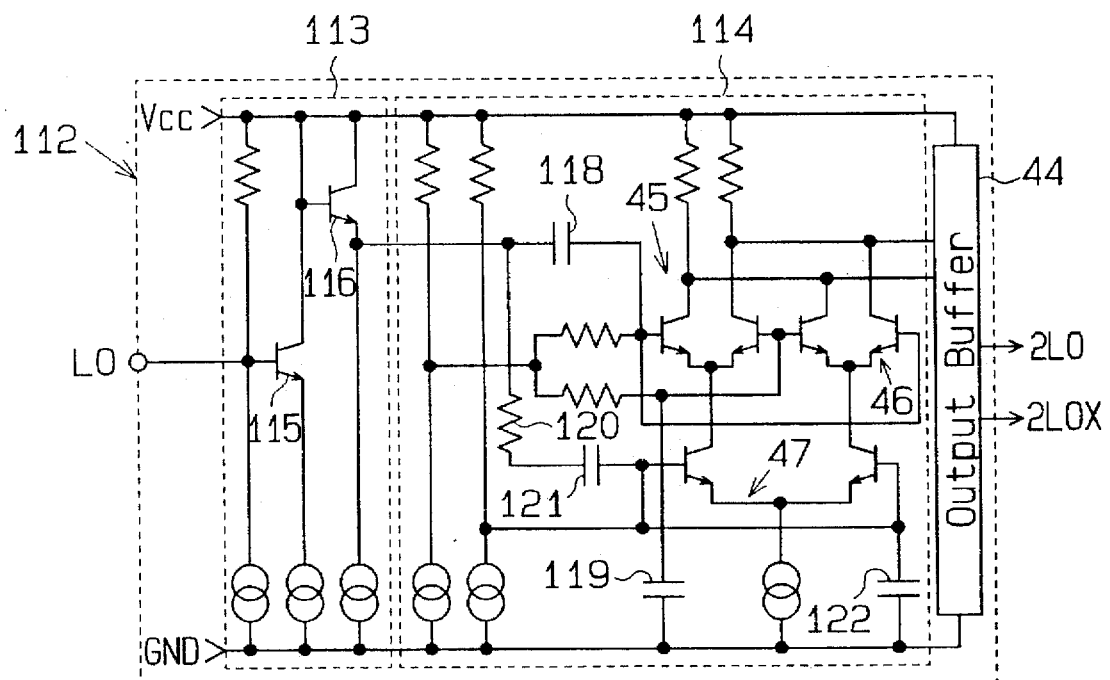
FIG. 21 is a circuit diagram illustrating a frequency multiplier according to a fourth embodiment of the present invention.

FIG. 21 illustrates another frequency multiplier 112 which can replace the frequency multiplier 102 in the modulator 101 according to the third embodiment. This frequency multiplier 112 has an input circuit 113, an analog multiplier 114 and an output buffer 44.

The input circuit 113 includes NPN transistors 115 and 116. The NPN transistor 115 has a collector connected to a power supply $V_{cc}$, an emitter connected to the ground GND via a constant current source, and a base to which the aforementioned carrier signal LO is input. The NPN transistor 116 has a collector connected to the power supply $V_{cc}$, an emitter connected to the ground GND via a constant current source, and a base connected to the collector of the NPN transistor 115. The input circuit 113 sends out a signal, which is obtained by performing the potential conversion on the carrier signal LO by those two NPN transistors 115 and 116, to the analog multiplier 114.

The analog multiplier 114 has the aforementioned first to third differential circuits 45, 46 and 47. The base of one of a pair of NPN transistors in each of the first and second differential circuits 45 and 46 is supplied with a reference signal and is also supplied with the output signal of the NPN transistor 116 via a capacitor 118. The base of the other NPN transistor in the differential circuit 45 or 46 is supplied with the reference signal and is connected to the ground GND via a capacitor 119. The base of one of a pair of NPN transistors in the third differential circuit 47 is supplied with the output signal of the NPN transistor 116 via a resistor 120 and a capacitor 121, which are connected in series. The base of the other NPN transistor in the differential circuit 47 is supplied with the reference signal and is connected to the ground GND via a capacitor 122. Based on the operations of the input circuit 113 and the analog multiplier 114, the output buffer 44 outputs the complementary signals 2LO and 2LOX which have been obtained by multiplying the frequency of the carrier signal LO by two.

Fifth Embodiment

Figure 22:
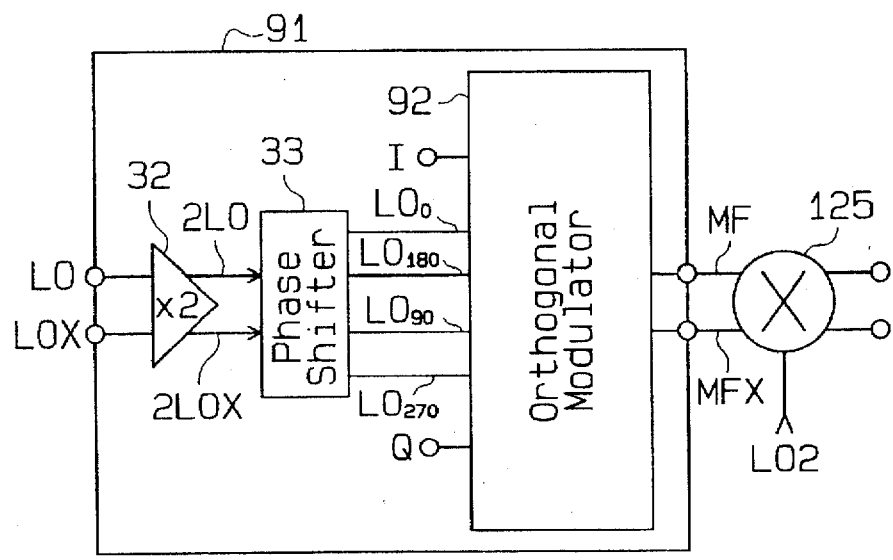
FIG. 22 is a circuit diagram of an indirect modulation type modulator according to a fifth embodiment of the present invention.

A fifth embodiment of the present invention will now be described referring to FIG. 22. To avoid the redundant description, like or same reference numerals are given to those components of the fifth embodiment, which are the same as the corresponding components of the second embodiment.

The fifth embodiment is an indirect modulation type modulator which has a transmission mixer 125 coupled to the output side of the modulator 91 shown in FIG. 15. The transmission mixer 125 has a differential input section and a differential output section. The input section of the transmission mixer 125 is differentially coupled to the modulator 91 which outputs the complementary output signals MF and MFX. The transmission mixer 125 combines the output signals MF and MFX with the second carrier signal LO2 to provide complementary signals.

According to this embodiment, the canceling of a part of the leak of the carrier signal LO with a part of the leak of the carrier signal LOX, both leaks being latent to the indirect modulation type modulator including the modulator 91 and transmission mixer 125, can suppress the carrier leaks from the output signals MF and MFX of the transmission mixer 125. Accordingly, the indirect modulation type modulator operates properly.

Sixth Embodiment

Figure 23:
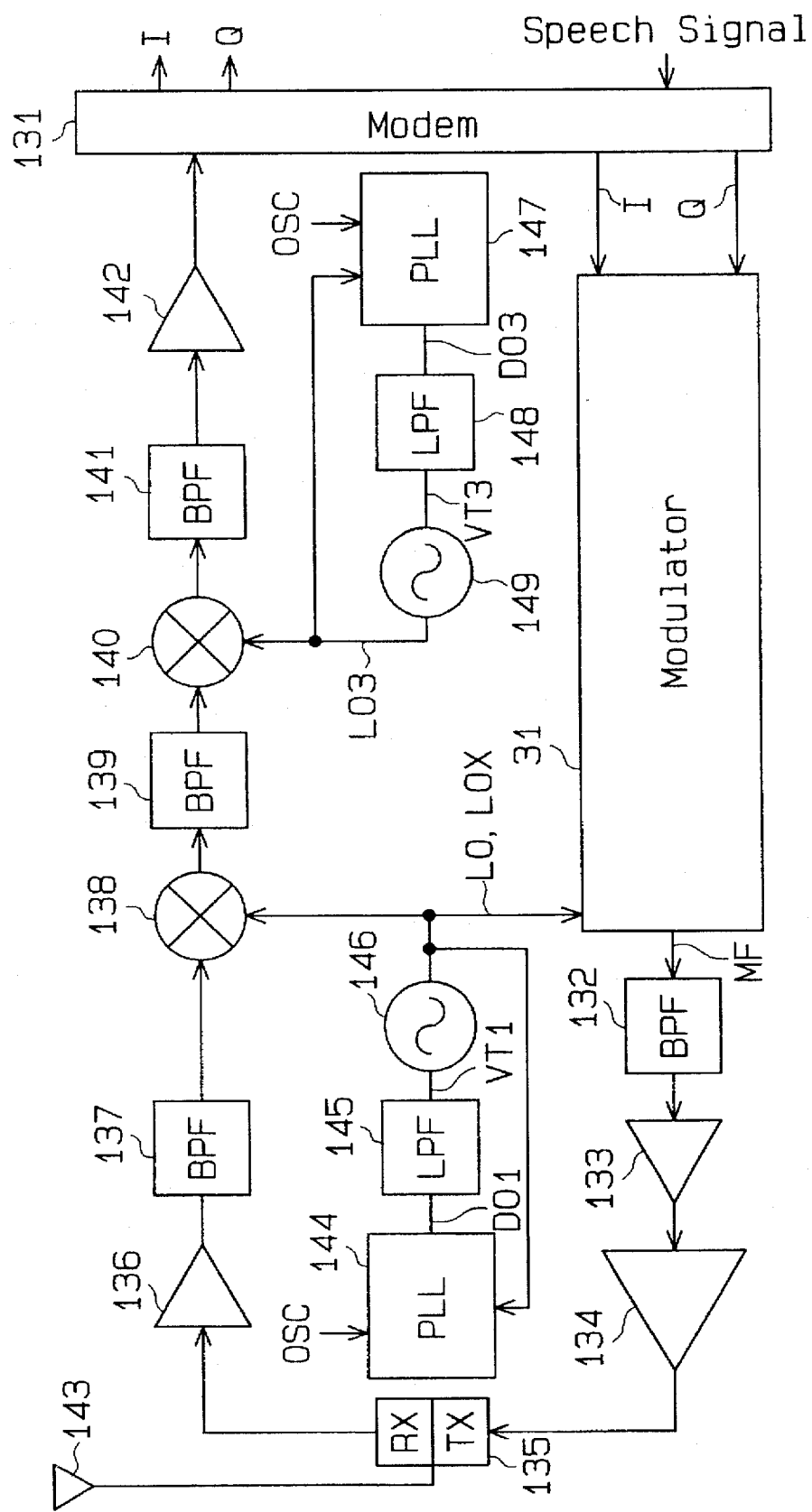
FIG. 23 shows a front end circuit section of a digital portable telephone according to a sixth embodiment of the present invention.

A sixth embodiment of the present invention will be discussed below referring to FIG. 23. FIG. 23 shows the front end section of a PDC (Personal Digital Cellular) type digital portable telephone as a digital mobile communication device. The modulator 31 (see FIG. 8) of the first embodiment is incorporated in this front end section.

A modem (modulator-demodulator) 131 converts an analog speech signal to parallel digital signals and then performs serial conversion on the parallel digital signals to produce baseband signals I and Q whose phases are shifted by 90 degrees from each other. Those baseband signals I and Q are supplied to the modulator 31.

Based on an oscillation signal OSC from an unillustrated crystal oscillator and carrier signals LO and LOX from a voltage controlled oscillator (VCO) 146, a PLL synthesizer 144 outputs a voltage signal DO1 to set the frequency of the carrier signal LO to a predetermined value. A low-pass filter (LPF) 145 smoothes the voltage signal DO1 from the PLL synthesizer 144 and provides the VCO 146 with a control voltage signal VT1 as an oscillation-frequency compensation signal. The voltage value of the control voltage signal VT1 is used to control the frequencies of the complementary carrier signals LO and LOX. The VCO 146 sends the complementary carrier signals LO and LOX to the modulator 31 and a reception mixer 138.

The modulator 31 combines the carrier signal LO with the baseband signals I and Q to produce the output signal MF. A band-pass filter (BPF) 132 passes a signal component of a predetermined frequency band in the output signal MF of the modulator 31. A driver amplifier 133 amplifies the output signal of the BPF 132, and a power amplifier 134 further amplifies the output signal of the driver amplifier 133. The output signal of the power amplifier 134 is transmitted from an antenna 143 via the transmission side TX of a switch 135.

The signal received at the antenna 143 is transferred to a low-noise amplifier (LA) 136 via the reception side RX of the switch 135. The received signal is amplified by the low-noise amplifier 136. A BPF 137 passes a signal component of a predetermined frequency band in the output signal of the low-noise amplifier 136.

The reception mixer 138 subtracts the carrier signal LO from the output signal of the BPF 137 to reduce the frequency of the received signal. A BPF 139 passes a signal component of a predetermined frequency band in the output signal of the reception mixer 138 to eliminate noise.

Based on the aforementioned oscillation signal OSC and an oscillation signal LO3 output from a VCO 149, a PLL synthesizer 147 outputs a voltage signal DO3 to set the frequency of the oscillation signal LO3 to a predetermined value. An LPF 148 smoothes the voltage signal DO3 from the PLL synthesizer 147 and provides the VCO 149 with a control voltage signal VT3 as an oscillation-frequency compensation signal. The voltage value of the control voltage signal VT3 is used to control the frequency of the oscillation signal LO3. The VCO 149 sends the oscillation signal LO3 to a reception intermediate mixer 140.

The reception intermediate mixer 140 subtracts the frequency of the oscillation signal LO3 from the frequency of the output signal of the BPF 139 to further reduce the frequency of the received signal. A BPF 141 passes a signal component of a predetermined frequency band in the output signal of the reception intermediate mixer 140. An amplifier 142 amplifies the output signal of the BPF 141 and sends the amplified signal to the modem 131. The modem 131 demodulates the output signal of the amplifier 142 to produce the baseband signals I and Q whose phases are shifted by 90 degrees from each other.

The PDC type digital portable telephone according to the sixth embodiment uses the modulator 31 that operates to effectively suppress the carrier leak CL from the output signal MF. As a result, the PDC type digital portable telephone has excellent communications performance.

Seventh Embodiment

Figure 24:
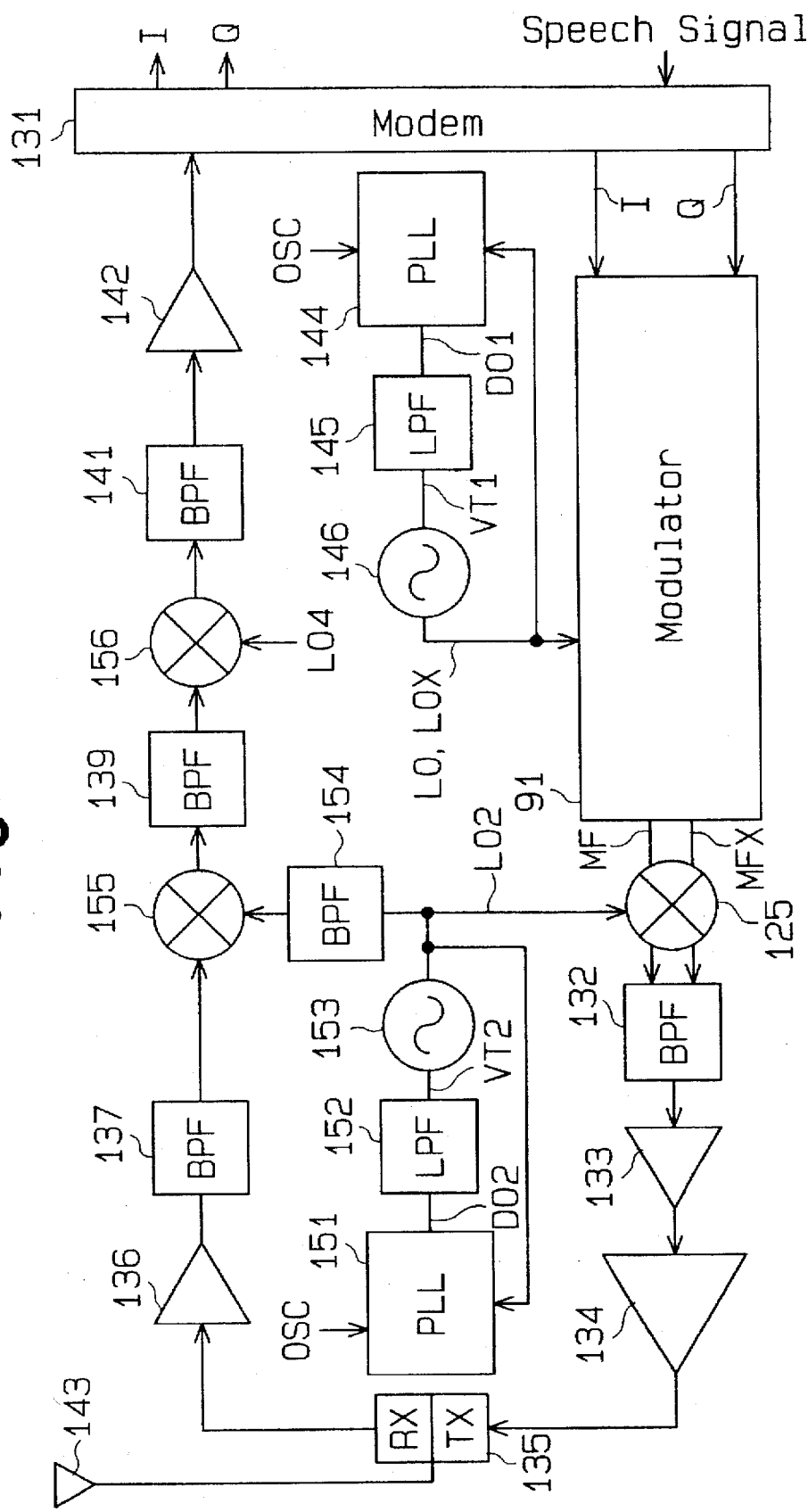
FIG. 24 shows a front end circuit section of a digital portable telephone according to a seventh embodiment of the present invention.

A seventh embodiment of the present invention will now be discussed with reference to FIG. 24. To avoid the redundant description, like or same reference numerals are given to those components of the seventh embodiment, which are the same as the corresponding components of the sixth embodiment. FIG. 24 shows the front end circuit section of a PHS (Personal Handyphone System) type digital portable telephone as a digital mobile communication device. The indirect modulation type modulator (see FIG. 22) of the fifth embodiment is incorporated in this front end circuit section.

The front end circuit section has a PLL synthesizer 144, LPF 145 and VCO 146. The VCO 146 sends the complementary carrier signals LO and LOX to a modulator 91. The modulator 91 combines the carrier signal LO with the baseband signals I and Q to produce complementary output signals MF and MFX.

Based on an oscillation signal OSC from an unillustrated crystal oscillator and a second carrier signal LO2 output from a VCO 153, a PLL synthesizer 151 outputs a voltage signal DO2 to set the frequency of the carrier signal LO2 to a predetermined value. An LPF 152 smoothes the voltage signal DO2 from the PLL synthesizer 151 and provides the VCO 153 with a control voltage signal VT2 as an oscillation-frequency compensation signal. The VCO 153 generates the second carrier signal LO2 having a frequency determined according to the voltage value of the control voltage signal VT2. The second carrier signal LO2 is also sent to a transmission mixer 125 and to a reception mixer 155 via a BPF 154.

The transmission mixer 125 combines the output signals MF and MFX with the second carrier signal LO2 to produce complementary output signals. A BPF 132 passes a signal component of a predetermined frequency band in each output signal of the transmission mixer 125. The output signal of the BPF 132 is amplified by a driver amplifier 133 and a power amplifier 134, and the amplified signal is transmitted from an antenna 143 via the transmission side TX of a switch 135.

The signal received at the antenna 143 is transferred to a low-noise amplifier (LA) 136 via the reception side RX of the switch 135. The LA 136 amplifies the received signal. A BPF 137 passes a signal component of a predetermined frequency band in the output signal of the LA 136. The reception mixer 155 subtracts an output signal LO2 of the BPF 154 from the output signal of the BPF 137 to reduce the frequency of the received signal. A BPF 139 passes a signal component of a predetermined frequency band in the output signal of the reception mixer 155 to eliminate noise.

A reception intermediate mixer 156 subtracts an oscillation signal LO4 from the output signal of the BPF 139 to further reduce the frequency of the received signal. A BPF 141 passes a signal component of a predetermined frequency band in the output signal of the reception intermediate mixer 156. The output signal of the BPF 141 is amplified by an amplifier 142 and the amplified signal is sent to a modem 131. The modem 131 demodulates the output signal of the amplifier 142 to produce the baseband signals I and Q whose phases are shifted by 90 degrees from each other.

The PHS type digital portable telephone according to the seventh embodiment uses the modulator 91 that operates to effectively suppress the carrier leaks from the output signals MF and MFX. As a result, the PHS type digital portable telephone has excellent communications performance.

Eighth Embodiment

Figure 25:
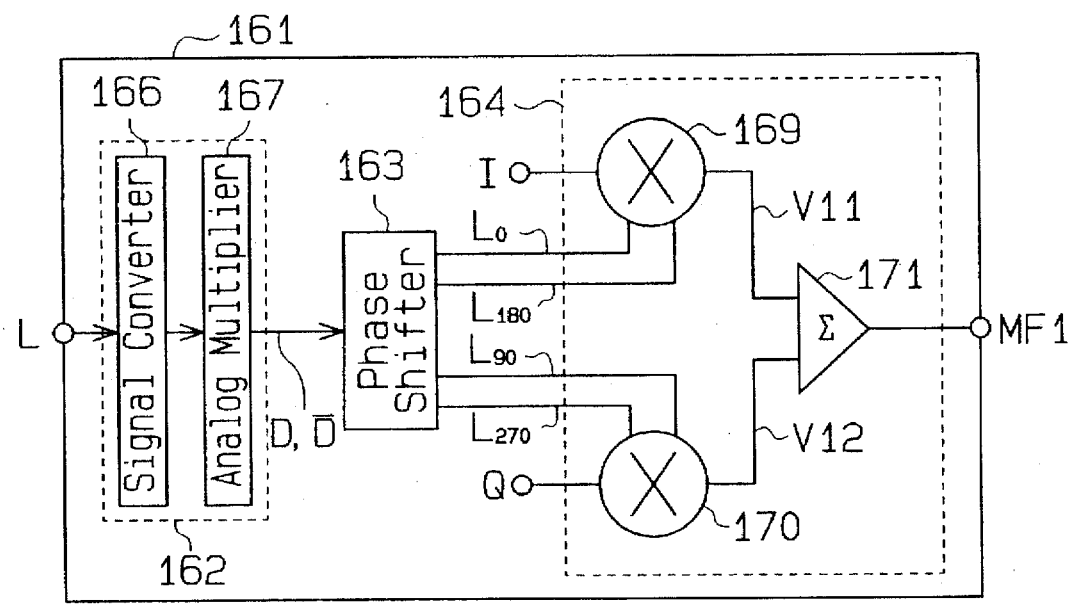
FIG. 25 is a circuit diagram showing a modulator according to an eighth embodiment of the present invention.

An eighth embodiment of the present invention will now be described with reference to FIGS. 25 and 26. FIG. 25 shows a modulator 161 of an orthogonal modulation type which is used in a digital mobile communication device. The modulator 161 has a frequency multiplier 162, a phase shifter 163 comprised of flip-flops, and an orthogonal modulator 164.

The frequency multiplier 162 includes a signal converter 166 and an analog multiplier 167. The signal converter 166 receives a carrier signal L as a voltage signal, and sends to the analog multiplier 167 first and second signals, which have the same frequency as that of the carrier signal L and have a phases difference of 90 degrees. Based on the first and second signals from the signal converter 166, the analog multiplier 167 produces complementary signals D and/D whose frequencies are twice the frequencies of the carrier signals L. The complementary signals D and/D are supplied to the phase shifter 163.

The phase shifter 163 divides the frequency of the output signal D by two to produce carrier signals $L_0$, $L_{90}$, $L_{180}$ and $L_{270}$ whose phases are shifted by 90 degrees from one another. The carrier signals $L_0$ and $L_{180}$ are complementary to each other, and the carrier signals $L_{90}$ and $L_{270}$ are likewise complementary to each other. Those carrier signals are sent to the orthogonal modulator 164.

The orthogonal modulator 164 has first and second modulation mixers 169 and 170 and an adder 171. The first modulation mixer 169 combines a baseband signal I as a modulation signal with the carrier signals $L_0$ and $L_{180}$ to produce a modulation signal V11. The second modulation mixer 170 combines a baseband signal Q as a modulation signal with the carrier signals $L_{90}$ and $L_{270}$ to produce a modulation signal V12. The adder 171 adds together the modulation signals V11 and V12 from the mixers 169 and 170 to produce an output signal MF1.

Figure 26:
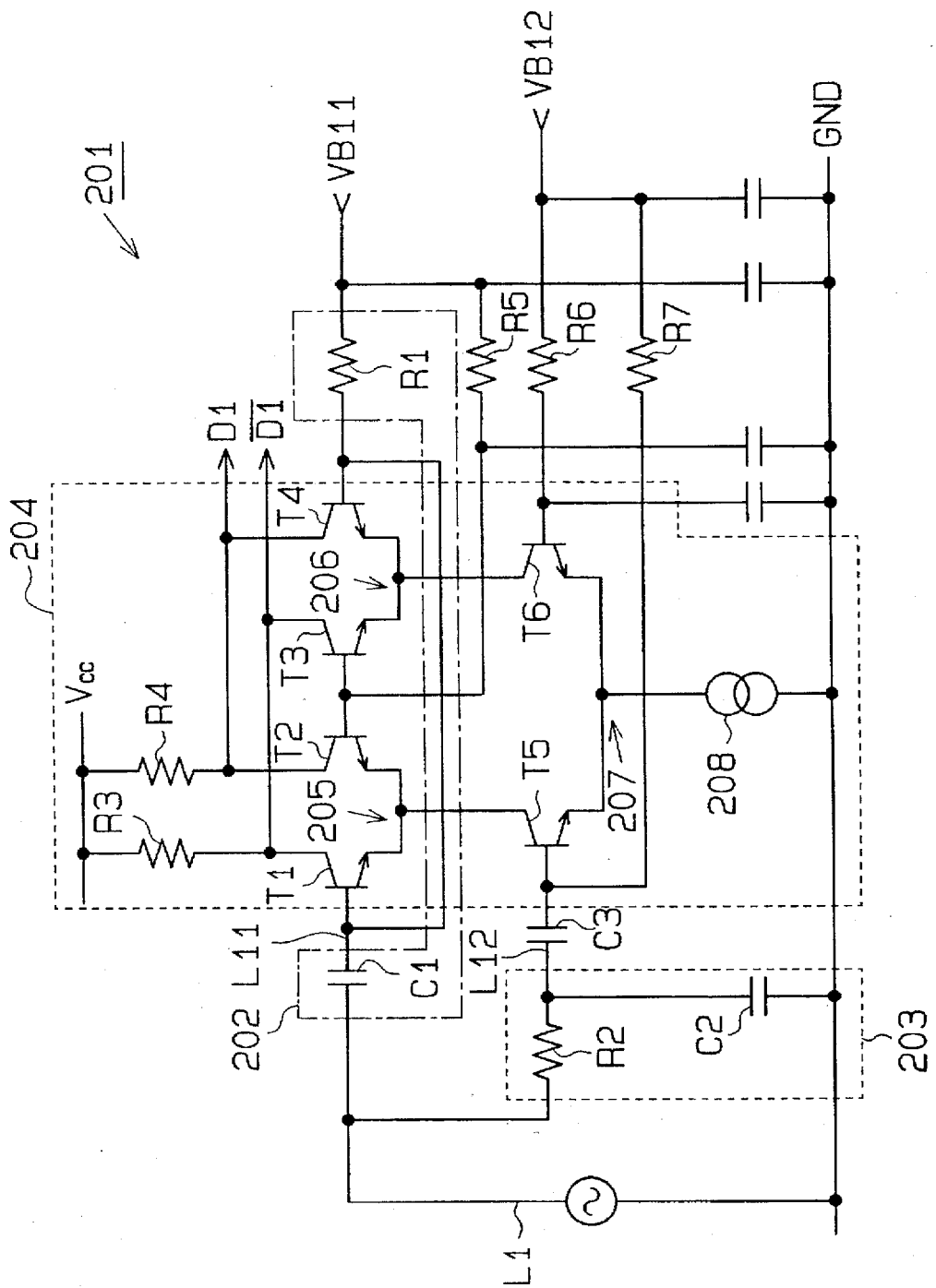
FIG. 26 is a circuit diagram showing a frequency multiplier in FIG. 25.

FIG. 26 presents the details of a frequency multiplier 201 which can be used as the frequency multiplier 162 shown in FIG. 25. This frequency multiplier 201 has a high-pass filter (HPF) 202 and a low-pass filter (LPF) 203 both are for signal conversion, and an analog multiplier 204 which is a Gillbert cell mixer. The frequency multiplier 201 sends out complementary output signals D1 and/D1 which are acquired by 20 doubling the frequency of the carrier signal L1 as a voltage signal.

The HPF 202 is designed as a differentiation circuit comprising a capacitor C1 and a resistor R1, and has a cutoff frequency of $1/(2\pi\ C1\ R1)$ Hz. The LPF 203 is designed as an integration circuit comprising a resistor R2 and a capacitor C2, and has a cutoff frequency of $1/(2\pi\ C2\ R2)$ Hz. The values of the capacitors C1 and C2 and the values of the resistors R1 and R2 are set so that the cutoff frequencies of the HPF 202 and LPF 203 equal to each other.

The HPF 202 passes the component of the carrier signal L1 whose frequency is equal to or higher than the cutoff frequency of the HPF 202, and inputs a voltage signal L11 (whose phase leads to the phase of the carrier signal L1) to the analog multiplier 204. The LPF 203 passes the component of the carrier signal L1 whose frequency is equal to or lower than the cutoff frequency of the LPF 203, and inputs a voltage signal L12 (whose phase lags from the phase of the carrier signal L1) to the analog multiplier 204.

If the frequency of the carrier signal L1 is equal to the cutoff frequencies of the HPF 202 and LPF 203, the phase of the voltage signal L11 leads to the phase of the carrier signal L1 by 45 degrees, and the phase of the voltage signal L12 lags from the phase of the carrier signal L1 by 45 degrees. Therefore, the difference between the phases of the voltage signals L11 and L12 is 90 degrees.

The analog multiplier 204 has first to third differential circuits 205, 206 and 207, a constant current circuit 208, and resistors R3 and R4. The first differential circuit 205 has a pair of NPN transistors T1 and T2, and the second differential circuit 206 has a pair of NPN transistors T3 and T4. The voltage signal L11 is input to the bases of the NPN transistors T1 and T4, and a reference signal VB11 is input via the resistor R1 to the bases of the NPN transistors T1 and T2. The reference signal VB11 is also input via a resistor R5 to the bases of the NPN transistors T2 and T3.

The third differential circuit 207 has a pair of NPN transistors T5 and T6. The voltage signal L12 is input via a capacitor C3 to the base of the NPN transistor T5, and a reference signal VB12 is input via a resistor R7 to the base of the NPN transistor T5. The reference signal VB12 is also input via a resistor R6 to the base of the NPN transistor T6.

Based on the voltage signal L12, the third differential circuit 207 alternately enables the first and second differential circuits 205 and 206. The NPN transistors T1 and T2 of the first differential circuit 205 are alternately turned on based on the voltage signal L11, and the NPN transistors T3 and T4 of the second differential circuit 206 are alternately turned on based on the voltage signal L11. As a result, a signal (i.e., the signal D1) obtained by multiplying the voltage signal V11 by the voltage signal V12 whose frequency is twice the frequency of the carrier signal L1 is output from the collector of each of the NPN transistors T2 and T4. Likewise, a signal (i.e., the signal D1) obtained by multiplying the voltage signal V11 by the voltage signal V12 whose frequency is twice the frequency of the carrier signal L1 is output from the collector of each of the NPN transistors T1 and T3.

Ninth Embodiment

Figure 27:
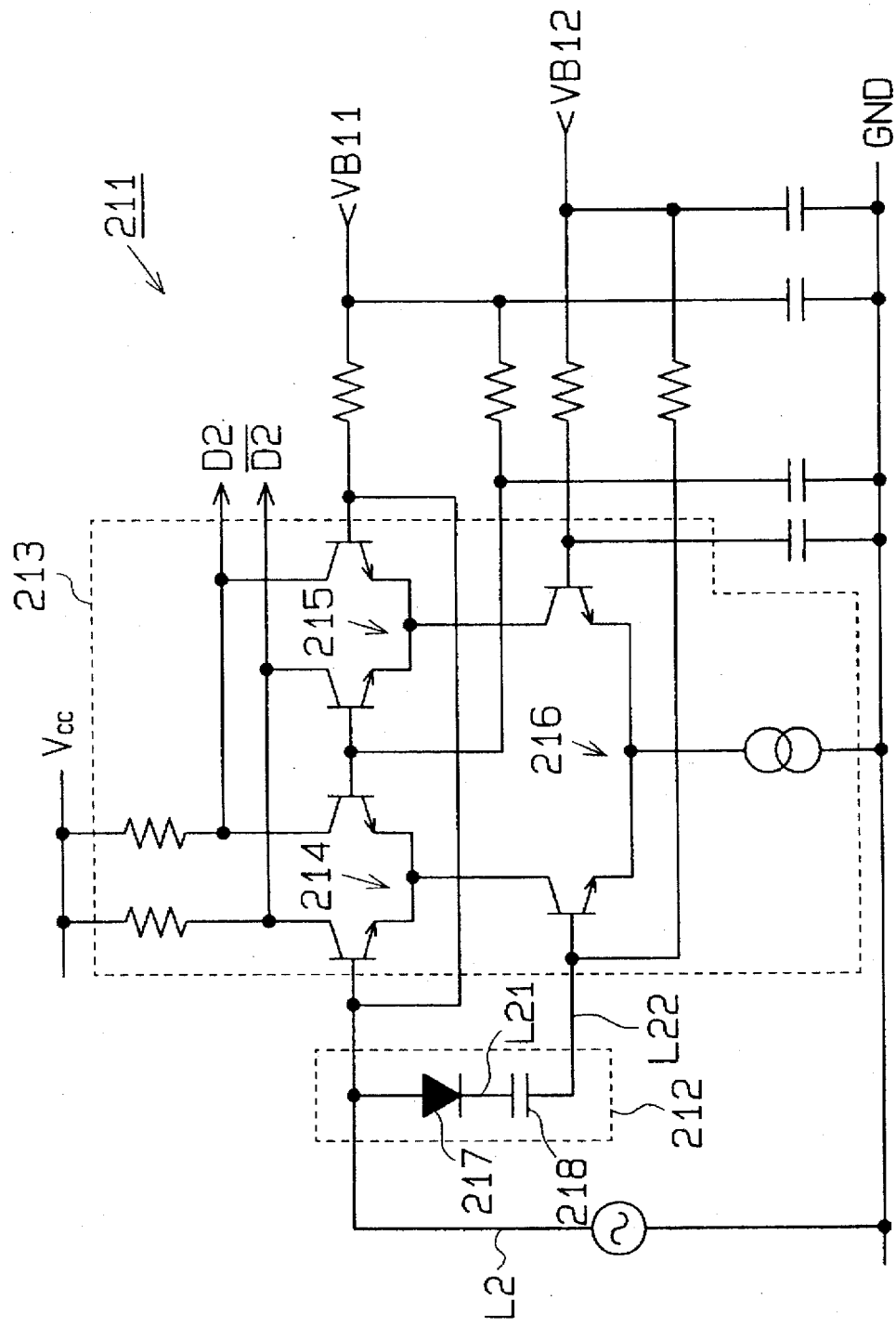
FIG. 27 is a circuit diagram illustrating a frequency multiplier according to a ninth embodiment of the present invention.

A ninth embodiment of the present invention will be described below with reference to FIGS. 27 to 30. FIG. 27 illustrates the schematic structure of a frequency multiplier 211 which can be used in the modulator 161 of the eighth embodiment. This frequency multiplier 211 has a signal converter 212 and an analog multiplier 213.

The signal converter 212 outputs a carrier signal L2 having a predetermined frequency as a first signal, and produces a current signal L22 as a second signal based on this carrier signal L2. The phase of the current signal L22 leads the phase of the carrier signal L2. The signal converter 212 has a diode 217 and a capacitor 218. The diode 217 produces a voltage signal L21 lower than the potential of the carrier signal L2 by the base-emitter voltage. The capacitor 218 converts the voltage signal L21 (which is an AC signal) to a current signal L22 whose phase leads to that of the voltage signal L21 by 90 degrees. The current signal L22 is then supplied to the analog multiplier 213.

The analog multiplier 213 includes first, second and third differential circuits 214, 215 and 216. The differential circuits 214 and 215 operate in response to the carrier signal L2. The third differential circuit 216 responds to the current signal L22 to alternately enable the two differential circuits 214 and 215. The analog multiplier 213 multiplies the voltage signal L2 and the current signal L22 by each other to produce complementary signals D2 and/D2 whose frequencies are two times the frequency of the voltage signal.

A description will be now given of a frequency multiplier 221 which is a modification of the frequency multiplier 211 shown in FIG. 27, with reference to FIGS. 28, 29A, 29B, 29C and 30.

The frequency multiplier 221 has a signal converter 223 and an analog multiplier 224. The signal converter 223 receives a carrier signal L2 which is a voltage signal, and outputs it as a first signal, and converts the carrier signal L2 to a current signal L22 as a second signal whose phase leads to that of the carrier signal L2. The signal converter 223 includes NPN transistors T11 and T12, a capacitor C11 and a resistor R11. The NPN transistor T11 is provided as an emitter follower circuit.

Figure 30:
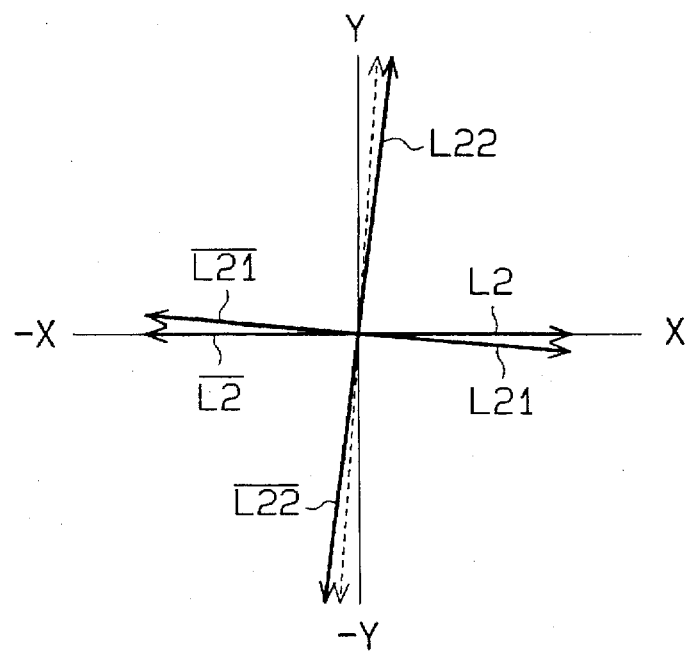
FIG. 30 is a vector diagram showing the relationship among the phases of individual signals in the frequency multiplier.

The first NPN transistor T11 has a collector connected to a high-potential power supply $V_{cc}$, and an emitter connected to the capacitor C11, and a base connected to a signal source 228 to receive the carrier signal L2 therefrom. The emitter of the first NPN transistor T11 is also connected to the collector of the second NPN transistor T12. The signal source 228 is connected to the ground GND as a low-potential power supply. The NPN transistor T11 serves as a diode and outputs from the emitter the voltage signal L21 whose potential is lower than the potential of the carrier signal L2 by the base-emitter voltage. Because the NPN transistor T11 has an output impedance, the vector phase of the voltage signal L21 lags from the vector phase of the carrier signal L2, as shown in FIG. 30.

The second NPN transistor T12 has an emitter connected to the low-potential power supply GND via the resistor R11 and a base to receive a reference signal VB13. In the ninth embodiment, the second NPN transistor T12 and the resistor R11 constitute an adjusting circuit. By changing the collector current of the NPN transistor T12 in accordance with a change in the voltage of the reference signal VB13, the adjusting circuit adjusts the output impedance of the NPN transistor T11 to thereby control the delay of the voltage signal L21 with respect to the carrier signal L2. The output impedance of the first NPN transistor T11 can be reduced by increasing the collector current of the second NPN transistor T12, or it can be increased by decreasing the collector current of the second NPN transistor T12.

Figure 29A:
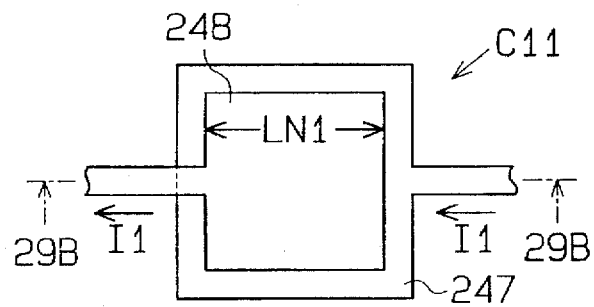
FIG. 29A is a plan view of a capacitor used in the frequency multiplier shown in FIG. 28.

The capacitor C11 converts the voltage signal L21 to the voltage signal L22 whose phase leads by 90 degrees to the phase of the voltage signal L21. The current signal L22 is then supplied to the analog multiplier 224. As shown in FIGS. 29A and 29B, the capacitor C11 has a first electrode 247 formed on a semiconductor substrate 245 via an insulating layer 246, and a second electrode 248 formed on the first electrode 247 via the insulating layer 246. The first and second electrodes 247 and 248 are made of polysilicon or aluminum.

The capacitor C11, when integrated on the semiconductor substrate, has a length LN1 in the direction where the current I1 flows, thereby producing a parasitic resistor. As shown in FIG. 30, therefore, the vector phase of the current signal L22 slightly lags from the vector phase indicated by the broken line which leads to the vector phase of the voltage signal L21 by 90 degrees. The vector phase of the current signal L22 leads to the vector phase of the carrier signal L2 by substantially 90 degrees.

Figure 29C:
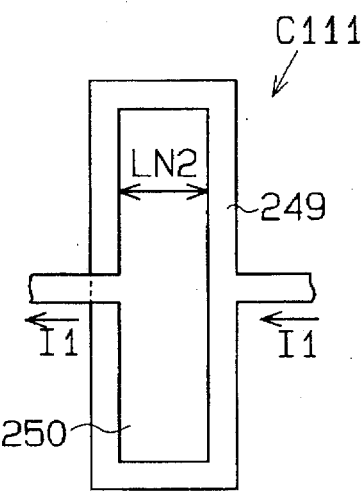
FIG. 29C is a plan view of another capacitor.
Figure 29B:
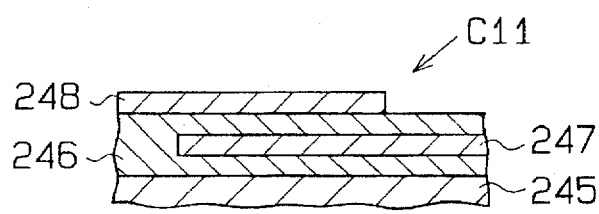
FIG. 29B is a cross-sectional view along the line 29B—29B in FIG. 29A.

The use of a capacitor C111 as shown in FIG. 29C is advantageous to reduce the delay of the current signal L22. The capacitor C111 has first and second electrodes 249 and 250, and the length, LN2, of the second electrode 250 in the direction where the current I1 flows is set shorter than the aforementioned length LN1 (LN2<LN1).

If the first and second electrodes 247 and 248 shown in FIG. 29A are made of aluminum, the parasitic resistor of the capacitor C11 becomes smaller to reduce the delay of the current signal L22. To set the capacitance of the capacitor C111 equal to that of the capacitor C11, the area of the second electrode 250 should be set equal to that of the second electrode 248.

Figure 28:
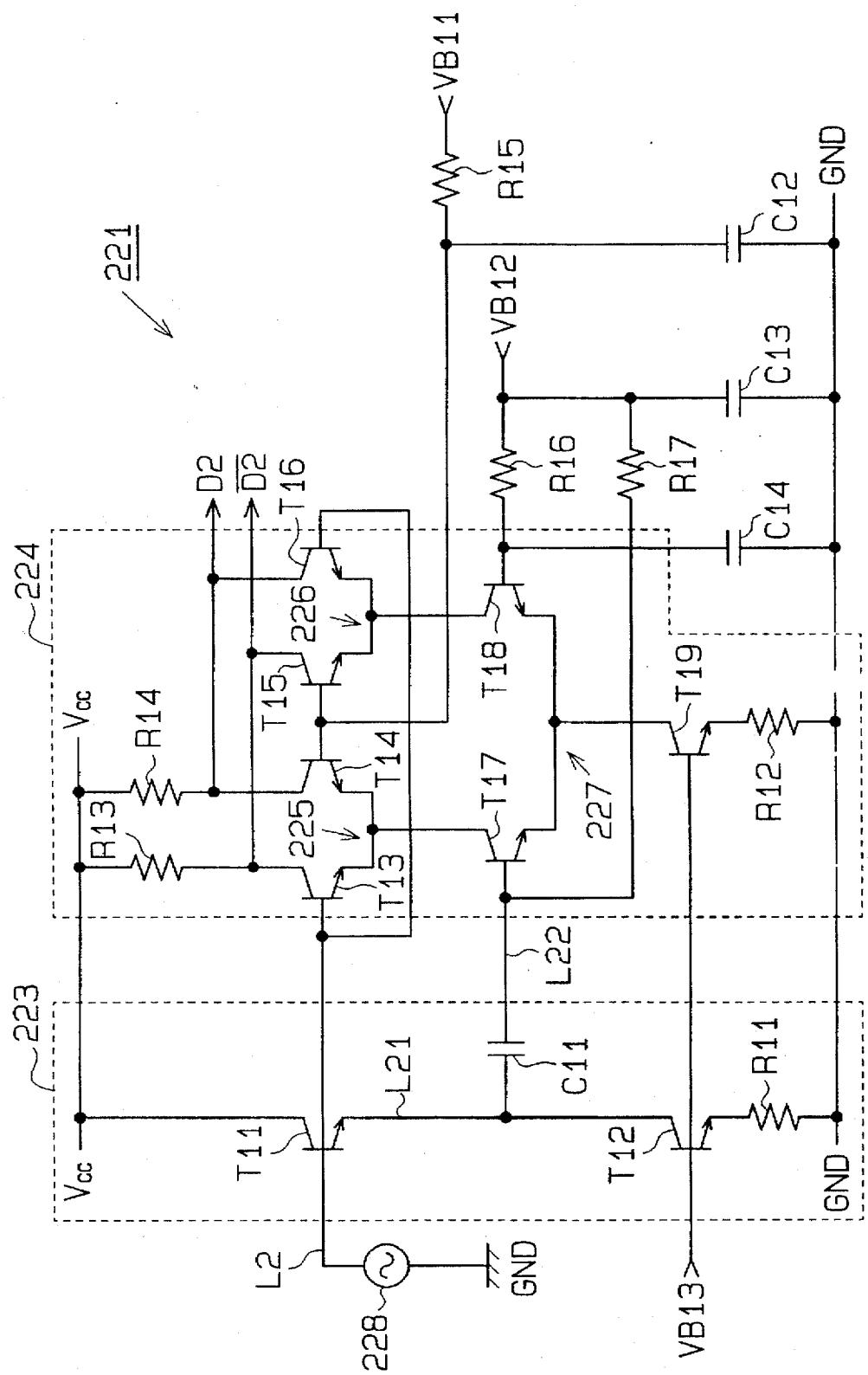
FIG. 28 is a detailed circuit diagram of the frequency multiplier.

The analog multiplier 224 shown in FIG. 28 has first, second and third differential circuits 225, 226 and 227. The first and second differential circuits 225 and 226 operate based on the carrier signal L2. The third differential circuit 227 alternately enables the first and second differential circuits 225 and 226 based on the current signal L22, an NPN transistor T19, and resistors R12, R13 and R14.

The first differential circuit 225 has a pair of emitter-coupled NPN transistors T13 and T14. The collectors of the NPN transistors T13 and T14 are connected to a power supply $V_{CC}$ via the resistors R13 and R14, respectively. The second differential circuit 226 has a pair of emitter-coupled NPN transistors T15 and T16 whose collectors are connected to the power supply $V_{CC}$ via the resistors R13 and R14, respectively. The NPN transistors T13 and T16 receive at their bases the carrier signal L2 as the first signal. The NPN transistors T14 and T15 have their bases connected to both the ground GND via a capacitor C12 and to the reference signal VB11 via the resistor R15.

The third differential circuit 227 has a pair of emitter-coupled NPN transistors T17 and T18. The NPN transistor T17 has a collector connected to the first differential circuit 225, an emitter connected to the collector of an NPN transistor T19, and a base connected to the ground GND via a resistor R17 and a capacitor C13. The NPN transistor T18 has a collector connected to the second differential circuit 226, an emitter connected to the collector of the NPN transistor T19, and a base connected to the ground GND via a capacitor C14.

The base of the NPN transistor T17 receives the current signal L22 and receives the reference signal VB12 via the resistor R17. The base of the NPN transistor T18 receives the reference signal VB12 via the resistor R16.

The NPN transistor T19 has an emitter connected to the ground GND via the resistor R12, and a base to which the reference signal VB13 is input. In this ninth embodiment, the NPN transistor T19 and the resistor R12 constitute a constant current circuit. Based on the reference signal VB13, the NPN transistor T19 enables the third differential circuit 227. The third differential circuit 227, when enabled, alternately enables the first and second differential circuits 225 and 226 in accordance with the difference between the current signal L22 and the current which is based on the reference signal VB12.

The NPN transistors T13 and T14 of the first differential circuit 225 are alternately turned on based on the voltage of the carrier signal L2 and the voltage of the reference signal VB11. Likewise, the NPN transistors T15 and T16 of the second differential circuit 226 are alternately turned on based on the voltage of the carrier signal L2 and the voltage of the reference signal VB11. As a result, the signal D2 which is obtained by combining the carrier signal L2 with the current signal L22 is output from the collector of each of the NPN transistors T14 and T16, and the signal /D2 which is obtained by combining the carrier signal L2 with the current signal L22 is output from the collector of each of the NPN transistors T13 and T15. Those output signals D2 and /D2 have frequencies which are approximately two times the frequency of the carrier signal L2.

The ninth embodiment has the following advantages.

As mentioned above, the signal converter 223 has the NPN transistor T11 which receives the carrier signal L2 and outputs the voltage signal L21, and the capacitor C11 which converts the voltage signal L21 to the current signal L22. Although the phase of the voltage signal L21 lags from the phase of the carrier signal L2, the capacitor C11 can convert the voltage signal L21 to the current signal L22 whose phase leads to the phase of the voltage signal L21 by nearly 90 degrees, regardless of the frequency of the voltage signal L21. Therefore, the phase of the current signal L21 leads to that of the carrier signal L2 by about 90 degrees. Although the output signal D2 of the frequency multiplier 221 may contain a slight spurious component, the frequency multiplier 221 can nevertheless perform highly stable frequency multiplication on the carrier signal L2 over a wide band.

By increasing the collector current of the NPN transistor T12, the output impedance of the NPN transistor T11 is reduced to decrease the delay of the voltage signal L21 with respect to the phase of the carrier signal L2. It is thus possible to set the difference between the phase of the current signal L22 and the phase of the carrier signal L2 as close to 90 degrees as possible. Hence, any spurious component of the output signal D2 can be significantly reduced. Consequently, the frequency multiplier 221 performs highly stable frequency multiplication on the carrier signal L2 over a wide band.

The capacitor C11 in the signal converter 223 can convert the voltage signal L21 to the current signal L22 whose phase leads to the phase of the voltage signal L21 by substantially 90 degrees, regardless of its capacitance. Even if the device constant of the capacitor varies due to the unstable manufacturing process, therefore, highly stable frequency multiplication can be performed on the carrier signal L2 of a wide band.

The modulator 161 which uses the highly stable frequency multiplier 221 can execute orthogonal modulation on the carrier signal L2 of a wide band. Because of the simple circuit structure shown in FIG. 28, the signal converter 223 contributes to improving the integration of an IC for digital mobile communications.

Tenth Embodiment

Figure 31:
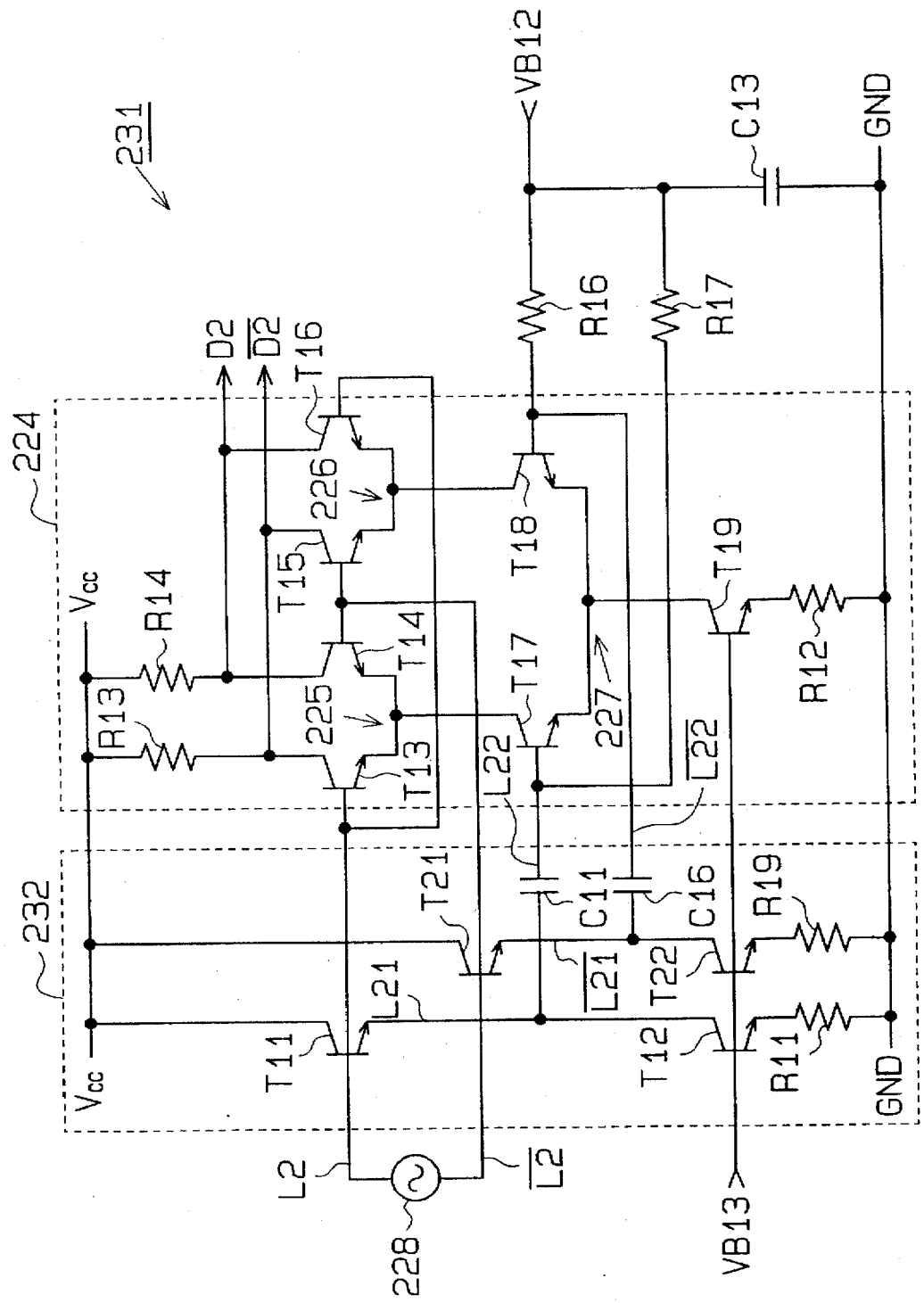
FIG. 31 is a circuit diagram illustrating a frequency multiplier according to a tenth embodiment of the present invention.

A tenth embodiment of the present invention will now be discussed referring to FIG. 31. To avoid the redundant description, like or same reference numerals are given to those components of the tenth embodiment, which are the same as the corresponding components of the ninth embodiment. FIG. 31 shows a frequency multiplier 231 which may be used in the modulator 161 shown in FIG. 25. A signal source 228, which is not connected to the low-potential power supply GND, outputs complementary carrier signals L2 and /L2 as voltage signals.

The frequency multiplier 231 has a signal converter 232 and the aforementioned analog multiplier 224. The frequency multiplier 231 receives the complementary carrier signals L2 and /L2, and produces complementary signals D2 and /D2 whose frequencies are twice the frequency of the carrier signal L2.

The signal converter 232 includes NPN transistors T11, T12, T21 and T22, capacitors C11 and C16, and resistors R11 and R19. The NPN transistors T11 and T21 are provided as an emitter follower circuit.

The NPN transistor T21 has a collector connected to the high-potential power supply $V_{CC}$, an emitter connected to the capacitor C16, and a base connected to the signal source 228 to receive the carrier signal /L2 therefrom. The emitter of the NPN transistor T21 is also connected to the collector of the NPN transistor T22. The NPN transistor T21 serves as a diode and outputs from the emitter the voltage signal /L21 whose potential is lower than the potential of the carrier signal /L2 by the base-emitter voltage. Because the NPN transistor T21 has an output impedance, the vector phase of the voltage signal /L21 lags from the vector phase of the carrier signal /L2, as shown in FIG. 30.

The NPN transistor T22 has an emitter connected to the low-potential power supply GND via the resistor R19 and a base to receive a reference signal VB13. In the tenth embodiment, the NPN transistor T22 and the resistor R19 constitute an adjusting circuit for the NPN transistor T21. This adjusting circuit alters the voltage of the reference signal VB13 to change the collector current of the NPN transistor T22 to thereby adjust the output impedance of the NPN transistor T21. As a result, the delay of the voltage signal /L21 with respect to the carrier signal /L2 is controlled.

The capacitor C16 converts the voltage signal /L21 (which is an AC signal) to the current signal /L22 whose phase leads to that of the voltage signal /L21 by 90 degrees. The current signal /L22 is supplied to the analog multiplier 224. The capacitor C16 also has the same structure as the capacitor C11 shown in FIG. 29A.

The NPN transistor T14 of the first differential circuit 225 and the NPN transistor T15 of the second differential circuit 226 receive the carrier signal /L2 as the first signal at their bases. The current signal /L22 is input as the second signal to the base of the NPN transistor T18 of the third differential circuit 227, and the reference signal VB12 is also input to the base of the NPN transistor T18 via a resistor R16.

The third differential circuit 227, when enabled, alternately enables the first and second differential circuits 225 and 226 based on the difference between the current signals L22 and /L22. The NPN transistors T13 and T14 of the first differential circuit 225 are alternately turned on in accordance with the voltages of the carrier signals L2 and /L2. Likewise, the NPN transistors T15 and T16 of the second differential circuit 226 are alternately turned on in accordance with the voltages of the carrier signals L2 and /L2. As a result, the signal D2 which is obtained by combining the carrier signal L2 with the current signal L22 is output from the collector of each of the NPN transistors T14 and T16, and the signal /D2 which is obtained by combining the carrier signal L2 with the current signal L22 is output from the collector of each of the NPN transistors T13 and T15. Those output signals D2 and /D2 have frequencies which are approximately twice the frequency of the carrier signal L2, but may have small spurious components.

The tenth embodiment has the following advantages in addition to the above-described advantages of the ninth embodiment (including the reduction of any spurious components). Because the complementary carrier signals L2 and /L2 are input to the first and second differential circuits 225 and 226 and the complementary current signals L22 and /L22 are input to the third differential circuit 227, the frequency multiplier 231 can operate efficiently even if the amplitudes of the carrier signals L2 and /L2 are made lower. Further, the leak from the carrier signal L2 toward the output side of the frequency multiplier 231 is effectively suppressed.

Eleventh Embodiment

Figure 32:
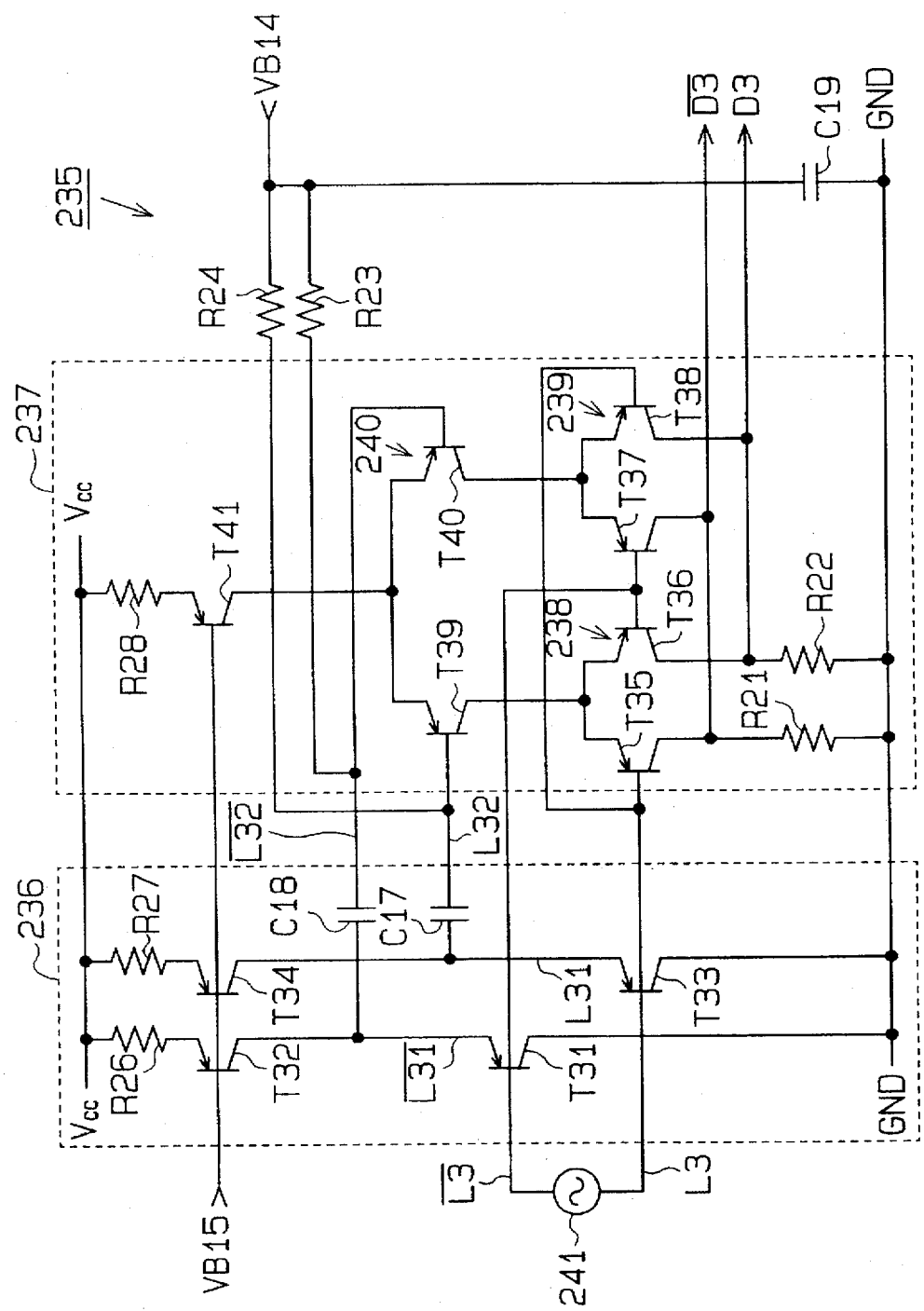
FIG. 32 is a circuit diagram of a frequency multiplier according to an eleventh embodiment of the present invention.

An eleventh embodiment of the present invention will now be discussed referring to FIG. 32. To avoid the redundant description, like or same reference numerals are given to those components of the eleventh embodiment, which are the same as the corresponding components of the ninth and tenth embodiments. FIG. 32 shows a frequency multiplier 235 which may be used in the modulator 161 shown in FIG. 25. A signal source 241, which is not connected to the low-potential power supply GND, outputs complementary carrier signals L3 and /L3 as voltage signals.

The frequency multiplier 235 comprises a signal converter 236 including a plurality of PNP transistors, and an analog multiplier 237 including a plurality of PNP transistors. The frequency multiplier 235 receives the complementary carrier signals L3 and /L3, and produces complementary signals D3 and /D3 whose frequencies are twice the frequency of the carrier signal L3.

The signal converter 236 includes PNP transistors T31, T32, T33 and T34, capacitors C17 and C18, and resistors R26 and R27. The PNP transistors T31 and T33 are provided as an emitter follower circuit.

The PNP transistors T31 and T33 serve as diodes and output from their emitters the voltage signals L31 and /L31 whose potentials are higher than the potentials of the carrier signals L3 and /L3 by the base-emitter voltage.

The PNP transistors T32 and T34 and the resistors R26 and R27 constitute an adjusting circuit for the PNP transistors T31 and T33. This adjusting circuit alters the voltage of a reference signal VB15 to change the collector currents of the PNP transistors T32 and T34 to thereby adjust the output impedances of the PNP transistors T31 and T33. Accordingly, the delays of the voltage signals L31 and /L31 with respect to the carrier signals L3 and /L3 are controlled.

The capacitors C17 and C18 convert the voltage signals L31 and /L31 (which are AC signals) to the current signals L32 and /L32 whose phases lead to those of the voltage signals L31 and /L31 by 90 degrees. The current signals L32 and /L32 are supplied to the analog multiplier 237. Each of the capacitors C17 and C18 have the same structure as the capacitor C11 shown in FIG. 29A.

The analog multiplier 237 comprises first, second and third differential circuits 238, 239 and 240. The first and second differential circuits 238 and 239 operate based on the carrier signals L3 and /L3 as first signals. The third differential circuit 240 alternately enables the first and second differential circuits 238 and 239 based on the current signals L32 and /L32 as the second signals, a PNP transistor T41, and resistors R21, R22 and R28.

The first differential circuit 238 has a pair of PNP transistors T35 and T36 which respectively receive the carrier signals L3 and /L3 at their bases. The second differential circuit 239 has a pair of PNP transistors T37 and T38 which respectively receive the carrier signals /L3 and L3 at their bases.

The third differential circuit 240 has a pair of PNP transistors T39 and T40. The current signal L32 is input to the base of the PNP transistor T39, and a reference signal VB14 is also input, via a resistor R24, to the base of the PNP transistor T39. The current signal /L32 is input to the base of the PNP transistor T40, and the reference signal VB14 is also input to the base of the PNP transistor T40 via a resistor R23.

The PNP transistor T41 has an emitter connected to the high-potential power supply $V_{cc}$ via the resistor R28, and a base to which the reference signal VB15 is input. The PNP transistor T41 and the resistor R28 constitute a constant current circuit. The PNP transistor T41 is turned on based on the reference signal VB15 to enable the third differential circuit 240.

The third differential circuit 240, when enabled, alternately enables the first and second differential circuits 238 and 239 based on the difference between the current signals L32 and /L32. The PNP transistors T35 and T36 of the first differential circuit 238 are alternately turned on in accordance with the voltages of the carrier signals L3 and /L3. Likewise, the PNP transistors T37 and T38 of the second differential circuit 239 are alternately turned on in accordance with the voltages of the carrier signals L3 and /L3. As a result, the signal D3 which is obtained by combining the carrier signal L3 with the current signal L32 is output from the collector of each of the PNP transistors T36 and T38, and the signal /D3 which is obtained by combining the carrier signal L3 with the current signal L32 is output from the collector of each of the PNP transistors T35 and T37. Those output signals D3 and /D3 do not contain much spurious components and have frequencies which are approximately twice the frequency of the carrier signal L3. The eleventh embodiment has the same advantages as the tenth embodiment.

Although only several embodiments of the present invention have been described herein, it should be apparent to those skilled in the art that the present invention may be embodied in many other specific forms without departing from the spirit or scope of the invention. Particularly, it should be understood that the invention may be embodied in the following forms.

In the indirect modulation type modulator according to the fifth embodiment, the input section of the frequency multiplier 32 of the modulator 91 has a differential structure and the output section of the orthogonal modulator 92 also has a differential structure. The indirect modulation type modulator may be designed in such a way that only the output section of the orthogonal modulator 92 has a differential structure and the input section of the frequency multiplier receives only the carrier signal LO.

In the frequency multiplier 231 according to the tenth embodiment, the signal converter 232 may be replaced with the signal converter 236 which includes a plurality of PNP transistors as shown in FIG. 32. In the frequency multiplier 235 according to the eleventh embodiment, the signal converter 236 may be replaced with the signal converter 232 which includes a plurality of NPN transistors as shown in FIG. 31.

This invention may be adapted to a GSM (Global System for Mobile communication) type digital mobile telephone.

Therefore, the present examples and embodiments are to be considered as illustrative and not restrictive and the invention is not to be limited to the details given herein, but may be modified within the scope of the appended claims.

What is claimed is:

1. A modulator comprising:

a frequency multiplier for receiving complementary signals having a first frequency as first carrier signals and for outputting complementary signals with a frequency that is twice the first frequency of said first carrier signals, said frequency multiplier has an input circuit section including a differential circuit for receiving said complementary signals as said first carrier signals;

a phase shifter for dividing the frequency of said complementary signals from said frequency multiplier to produce a plurality of second carrier signals whose phases are shifted from one another by 90 degrees; and an orthogonal modulator for receiving an input signal and said second carrier signals from said phase shifter and for outputting signals obtained by combining said input signal with said second carrier signals.

2. A modulator comprising:

a frequency multiplier for receiving a first carrier signal and for outputting complementary signals whose frequencies are twice a frequency of said first carrier signal;

a phase shifter for dividing the frequency of said complementary signals from said frequency multiplier to produce a plurality of second carrier signals whose phases are shifted from one another by 90 degrees; and an orthogonal modulator for receiving an input signal and said second carrier signals from said phase shifter and for outputting complementary output signals obtained by combining said input signal with said second carrier signals, said orthogonal modulator having an output circuit section for producing said complementary output signals, said output circuit section including a differential circuit.

3. A modulator comprising:

a frequency multiplier for receiving complementary signals having a first frequency as first carrier signals and for outputting complementary signals with a frequency that is twice the first frequency of said first carrier signals, said frequency multiplier has an input circuit section including a differential circuit for receiving complementary signals as said first carrier signals;

a phase shifter for dividing the frequency of said complementary signals from said frequency multiplier to produce a plurality of second carrier signals whose phases are shifted from one another by 90 degrees; and an orthogonal modulator for receiving an input signal and said second carrier signals from said phase shifter and for outputting signals obtained by combining said input signal with said second carrier signals, said orthogonal modulator has an output circuit section including a differential circuit.

4. An indirect modulation type modulator comprising:

a frequency multiplier for receiving complementary signals having a first frequency as first carrier signals and for outputting complementary signals with a frequency that is twice the first frequency of said first carrier signals, said frequency multiplier has an input circuit section including a differential circuit for receiving complementary signals as said first carrier signals;

a phase shifter for dividing the frequency of said complementary signals from said frequency multiplier to produce a plurality of second carrier signals whose phases are shifted from one another by 90 degrees;

an orthogonal modulator for receiving an input signal and said second carrier signals from said phase shifter and for outputting signals obtained by combining said input signal with said second carrier signals, said orthogonal modulator has an output circuit section including a differential circuit; and a transmission mixer for receiving an output signal of said orthogonal modulator and a third carrier signal and for outputting a signal acquired by combining said output signal of said orthogonal modulator with said third carrier signal, said orthogonal modulator and said transmission mixer being differentially coupled.

5. A frequency multiplier for producing a signal whose frequency is twice a frequency of a voltage signal input thereto, comprising:

a signal converter for producing first and second signals which have a phase difference of 90 degrees, based on said input voltage signal; and an analog multiplier including first and second differential circuits operable based on said first signal, and a third differential circuit responsive to said second signal for alternately enabling said first and second differential circuits, said analog multiplier combining said first signal and said second signal to produce a signal whose frequency is twice the frequency of said voltage signal.

6. The frequency multiplier according to claim 5, wherein said signal converter outputs said input voltage signal directly as said first signal, and converts said voltage signal to a current signal whose phase leads to that of said voltage signal by about 90 degrees and outputs said current signal as said second signal.

7. The frequency multiplier according to claim 6, wherein said signal converter includes:

a diode for receiving said voltage signal; and a capacitor, provided between said diode and said third differential circuit, for converting a voltage signal output from said diode to a current signal whose phase leads to that of the voltage signal by about 90 degrees.

8. The frequency multiplier according to claim 7, wherein said diode is provided by an emitter follower circuit.

9. The frequency multiplier according to claim 7 further comprising an adjusting circuit for adjusting an output impedance of said diode.

10. The frequency multiplier according to claim 5, wherein said voltage signal is provided as complementary signals;

wherein said signal converter converts said complementary voltage signals to complementary current signals whose phases lead those of said voltage signals; and wherein complementary voltage signals are input as said first signal to each of said first and second differential circuits, and said complementary current signals are input as said second signal to said third differential circuit.

11. The frequency multiplier according to claim 10, wherein said signal converter includes:

two diodes for receiving said complementary voltage signals, respectively; and two capacitors, respectively provided between said two diodes and two input sections of said third differential circuit, for converting voltage signals output from said individual diodes to current signals whose phases lead from those of said voltage signals by about 90 degrees.

12. The frequency multiplier according to claim 11, wherein each of said diodes is provided by an emitter follower circuit.

13. The frequency multiplier according to claim 11 further comprising an adjusting circuit for adjusting an output impedance of each of said diodes.

14. The frequency multiplier according to claim 5, wherein each of said first and second differential circuits of said analog multiplier is comprised of a pair of NPN transistors.

15. The frequency multiplier as recited in claim 5, wherein each of said first and second differential circuits of said analog multiplier is comprised of a pair of PNP transistors.

16. A modulator comprising:

a frequency modulator for producing a signal whose frequency is twice a frequency of a voltage signal input thereto, including, a signal converter for producing first and second signals which have a phase difference of 90 degrees, based on said input voltage signal; and an analog multiplier including first and second differential circuits operable based on said first signal, and a third differential circuit responsive to said second signal for alternatively enabling said first and second differential circuits, said analog multiplier combining said first signal and said second signal to produce a combined signal whose frequency is twice the frequency of said input voltage signal;

a phase shifter for dividing the frequency of the combined signal output from said analog multiplier to produce a plurality of carrier signals whose phases are shifted from one another by 90 degrees; and an orthogonal modulator for receiving a modulation signal and said plurality of carrier signals from said phase shifter, and for outputting signals obtained by combining said modulation signal with said plurality of carrier signals.

* * * * *